(12) United States Patent
Ho et al.

(10) Patent No.: US 9,818,846 B2
(45) Date of Patent: Nov. 14, 2017

(54) SELECTIVELY DEPOSITED SPACER FILM FOR METAL GATE SIDEWALL PROTECTION

(71) Applicant: TAIWAN SEMICONDUCTOR MANUFACTURING CO., LTD., Hsinchu (TW)

(72) Inventors: Tsai-Jung Ho, Changhua County (TW); Pei-Ren Jeng, Chu-Bei (TW)

(73) Assignee: TAIWAN SEMICONDUCTOR MANUFACTURING CO., LTD., Taipei (TW)

( * ) Notice: Subject to any disclaimer, the term of this patent is extended or adjusted under 35 U.S.C. 154(b) by 15 days.

(21) Appl. No.: 15/259,394

(22) Filed: Sep. 8, 2016

(65) Prior Publication Data

US 2017/0213901 A1 Jul. 27, 2017

Related U.S. Application Data

(60) Provisional application No. 62/281,649, filed on Jan. 21, 2016.

(51) Int. Cl.
| | |
|---|---|
| *H01L 21/336* | (2006.01) |
| *H01L 29/66* | (2006.01) |
| *H01L 21/768* | (2006.01) |
| *H01L 21/283* | (2006.01) |
| *H01L 21/3065* | (2006.01) |

(52) U.S. Cl.
CPC ...... *H01L 29/66795* (2013.01); *H01L 21/283* (2013.01); *H01L 21/3065* (2013.01); *H01L 21/76895* (2013.01)

(58) Field of Classification Search
CPC .................... H01L 29/66795–29/66818; H01L 29/785–29/7858
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2014/0282326 A1 | 9/2014 | Chen et al. |
| 2016/0163816 A1* | 6/2016 | Yu ........................ H01L 29/6656 438/283 |

* cited by examiner

*Primary Examiner* — Daniel Shook
(74) *Attorney, Agent, or Firm* — McDermott Will & Emery LLP

(57) ABSTRACT

A method of fabricating a fin field-effect transistor (FinFET) device is provided. The method includes forming a carbon-based layer on a plurality of gate structures formed on a semiconductor substrate. Each gate structure overlies at least one fin formed on the semiconductor substrate. The carbon-based layer covers sidewalls of the gate structures. A metal silicide layer overlies the carbon-based layer. The metal silicide layer and carbon-based layer are removed, and a metal layer is formed between adjacent gate structures.

20 Claims, 23 Drawing Sheets

SELECTIVELY DEPOSITED SPACER FILM FOR METAL GATE SIDEWALL PROTECTION

CROSS REFERENCE TO PROVISIONAL APPLICATION

This application claims priority from U.S. provisional patent application Ser. No. 62/281,649; filed Jan. 21, 2016, the entire disclosure of which is incorporated herein by reference.

TECHNICAL FIELD

The disclosure relates to a semiconductor integrated circuit, more particularly to a semiconductor device having fin field effect transistor (FinFET) structures and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a FinFET. FinFET devices are a type of multi-gate structure that typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some FinFET devices, various contacts and multilayer interconnect features are formed to connect various features or structures of the FinFET device.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
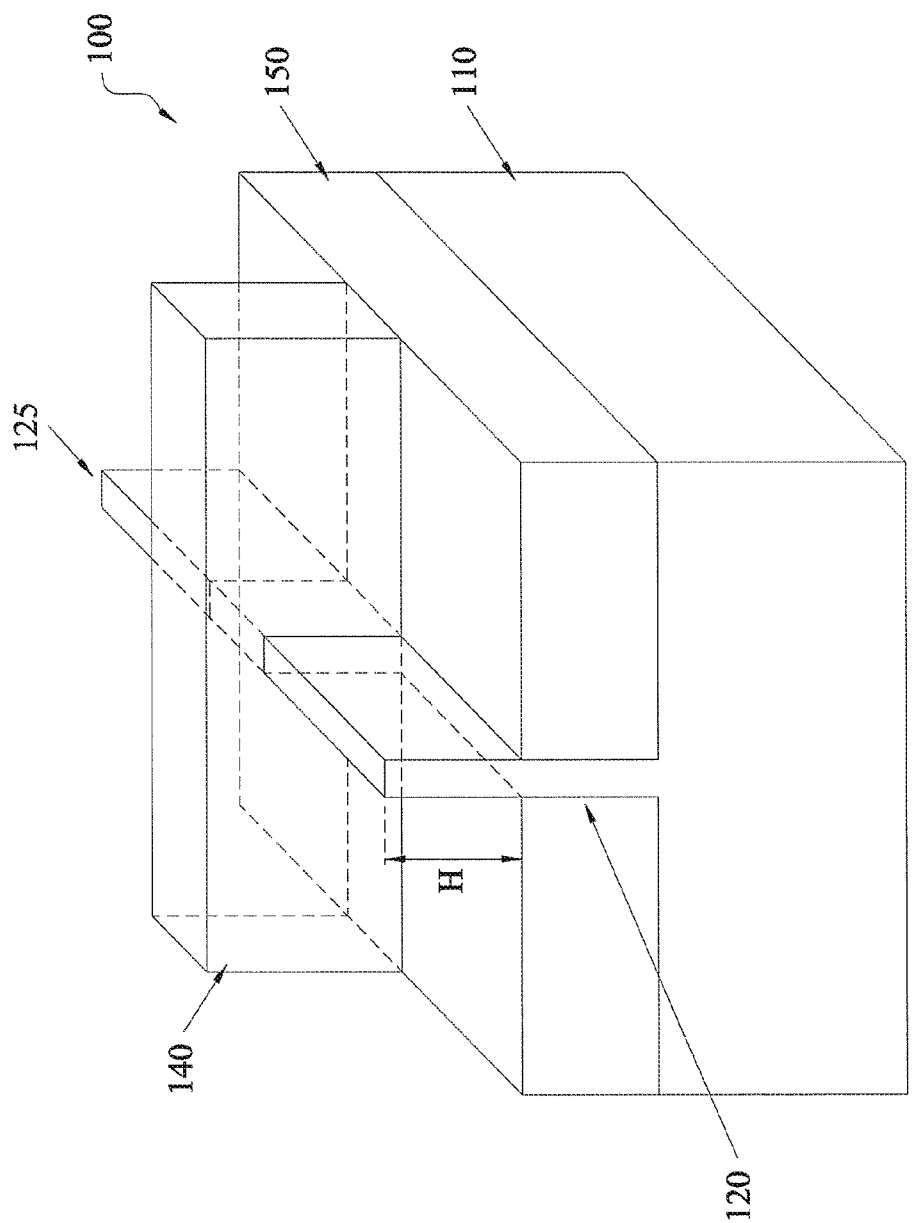
FIG. 1 is an exemplary perspective view of a Fin Field-Effect Transistor (FinFET) device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 2:
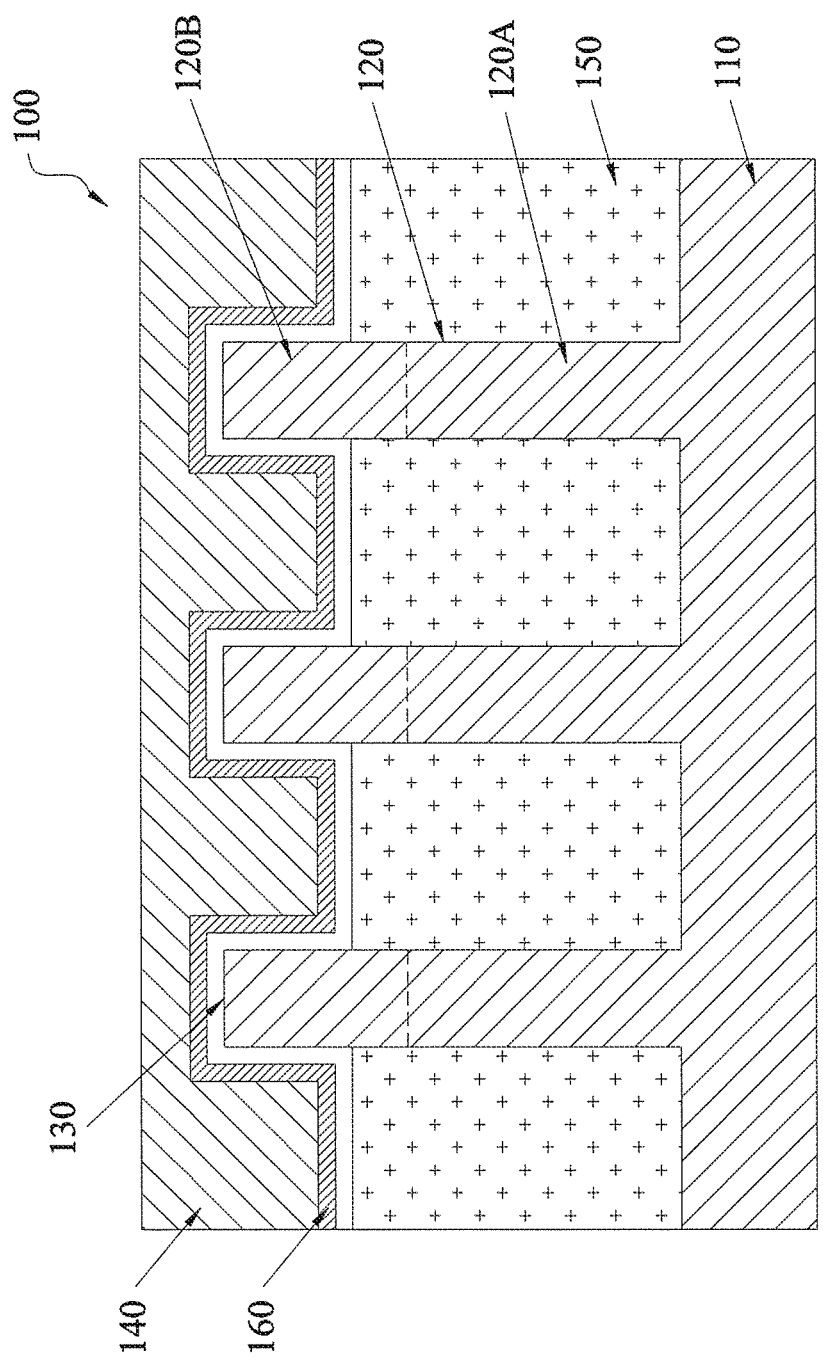
FIG. 2 is an exemplary cross sectional view of the FinFET device having a fin structure along a gate electrode according to embodiments of the present disclosure.

FIG. 1 is an exemplary perspective view of a Fin Field-Effect Transistor (FinFET) device 100 having a fin structure according to one embodiment of the present disclosure, and FIG. 2 is an exemplary cross sectional view of the FinFET device 100 having a fin structure along a gate electrode according to one embodiment of the present disclosure. In these figures, some layers/features may be omitted for simplification.

The FinFET device 100 depicted in FIGS. 1 and 2 includes, among other features, a substrate 110, a fin structure 120, a gate dielectric layer 130 and a gate electrode 140. In this embodiment, the substrate 110 is a silicon substrate. Alternatively, the substrate 110 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 110 is a silicon layer of an SOI (silicon-on insulator) substrate. When an SOI substrate is used, the fin structure 120 may protrude from the silicon layer of the SOI substrate or may protrude from the insulator layer of the SOI substrate. In the latter case, the silicon layer of the SOI substrate is used to form the fin structure 120. Amorphous substrates, such as amorphous Si or amorphous SiC, or insulating material, such as silicon oxide may also be used as the substrate 110. The substrate 110 may include various regions that have been suitably doped with impurities for a p-type or n-type conductivity.

The fin structure 120 is disposed over the substrate 110. The fin structure 120 may be made of the same material as the substrate 110 and may continuously extend from the substrate 110. In this embodiment, the fin structure 120 is made of silicon (Si). The silicon layer of the fin structure 120 may be intrinsic, or appropriately doped with an n-type impurity or a p-type impurity.

In FIG. 1, one fin structure 120 is disposed over the substrate 110, while in FIG. 2, three fin structures 120 are disposed over the substrate 110. However, the number of the fin structures is not limited to one or three. The numbers may be two or four or more. In addition, one or more dummy fin structures may be disposed in contact with both sides of the fin structures 120 to improve pattern fidelity in patterning processes. The width of the fin structure 120 is in a range of about 5 nm to about 40 nm in some embodiments, and in a range of about 7 nm to about 12 nm in other embodiments. The height of the fin structure 120 is in a range of about 100 nm to about 100 nm in some embodiments, and in a range of about 50 nm to 100 nm in other embodiments.

In FIG. 2, spaces between the fin structures 120 and/or a space between one fin structure and another element formed over the substrate 110 are filled by an isolation insulating layer (e.g., isolation region 150) including one or more layers of insulating materials. The insulating materials for the isolation region 150 may include one or more layers of silicon oxide, silicon nitride, silicon oxynitride (SiON), SiOCN, fluorine-doped silicate glass (FSG), or a low-k dielectric material.

The lower part of the fin structure 120 under the gate electrode 140 is referred to as a well region 120A, and the upper part of the fin structure 120 is referred to as a channel region 120B, as shown in FIG. 2. Under the gate electrode 140, the well region 120A is embedded in the isolation region 150, and the channel region 120B protrudes from the isolation region 150. A lower part of the channel region 120B may also be embedded in the isolation region 150 to a depth of about 1 nm to about 5 nm.

The channel region 120B protruding from the isolation region 150 is covered by a gate dielectric layer 130, and the gate dielectric layer 130 is further covered by a gate electrode 140. Part of the channel region 120B not covered by the gate electrode 140 functions as a source and/or drain of the FinFET device 100 (see, FIG. 1).

In certain embodiments, the gate dielectric layer 130 includes a single layer or alternatively a multi-layer structure, having one or more dielectric materials, such as a single layer of silicon oxide, silicon nitride, or high-k dielectric material, other suitable dielectric material, and/or combinations thereof, or a multilayer of two or more of these materials. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 140 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, one or more work function adjustment layers 160 may be interposed between the gate dielectric layer 130 and the gate electrode 140. The work function adjustment layer 160 may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers 160 are made of one or more conductive materials such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer 160 may include a first metal material for the n-channel FinFET and a second metal material for the p-channel FinFET. For example, the first metal material for the n-channel FinFET may include metals having a work function substantially aligned with a work function of the substrate conduction band, or at least substantially aligned with a work function of the conduction band of the channel region 120B. Similarly, for example, the second metal material for the p-channel FinFET may include metals having a work function substantially aligned with a work function of the substrate valence band, or at least substantially aligned with a work function of the valence band of the channel region 120B. In some embodiments, the work function adjustment layer 160 may alternatively include a polysilicon layer. The work function adjustment layer 160 may be formed by ALD, PVD, CVD, e-beam evaporation, or other suitable process. Further, the work function adjustment layer 160 may be formed separately for the n-channel FinFET and the p-channel FinFET which may use different metal layers.

Source and drain regions 125 are also formed in the upper part of the fin structure 120 not covered by the gate electrode 140, by appropriately doping impurities in the source and drain regions 125. An alloy of Si or Ge and a metal such as Co, Ni, W, Ti or Ta may be formed on the source and drain regions 125. In some aspects, strained materials in the source and drain regions 125 utilize, for example, phosphorous doped silicon-containing epitaxial layering.

FIGS. 3-23B illustrate examples of cross-sectional views of intermediate stages in the sequential fabrication of a FinFET device 300 in accordance with some embodiments of the present disclosure. Not all of the depicted components may be required, however, and one or more implementations may include additional components not shown in the figure. Variations in the arrangement and type of the components may be made without departing from the scope of the claims as set forth herein. Additional processes, operations, material, components, different components, or fewer components may be provided. Further, the order of the operations may be changed.

Figure 3:
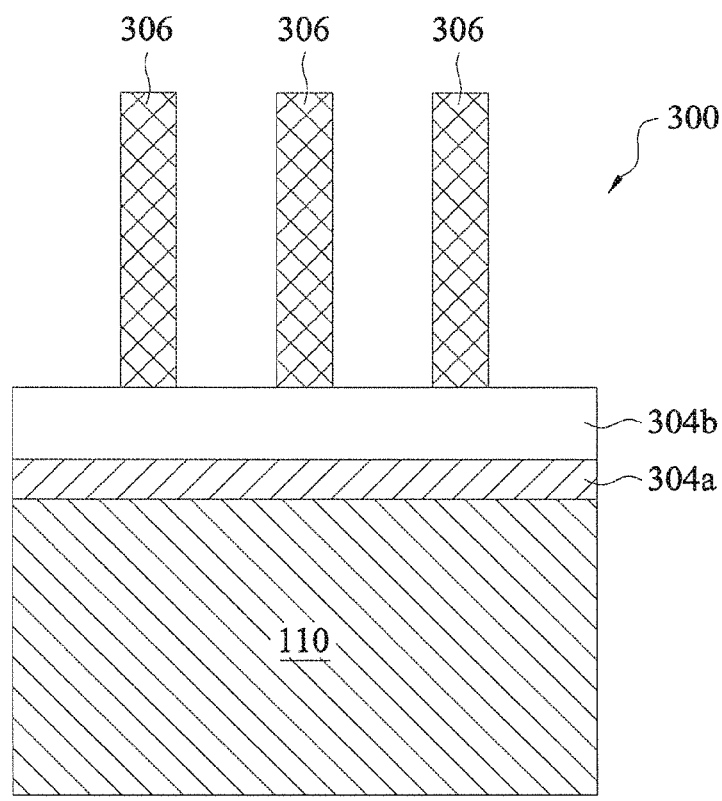
FIGS. 3-8 illustrate cross-sectional views of operations in the sequential fabrication process of a FinFET structure according to embodiments of the present disclosure.

FIG. 3 is a cross-sectional view of the FinFET device 300 having a substrate 110 at one of various stages of the sequential fabrication process according to an embodiment of the present disclosure. In this embodiment, the substrate 110 includes a crystalline silicon substrate (e.g., wafer). A p-type substrate or n-type substrate may be used and the substrate 110 may include various doped regions, depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 110 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Also alternatively, the substrate may include an epitaxial layer. For example, the substrate may have an epitaxial layer overlying a bulk semiconductor. Further, the substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the substrate may include a SOI structure. Also alternatively, the substrate may include a buried dielectric layer, such as a buried oxide (BOX) layer, such as that formed by separation by implantation of oxygen (SIMOX) technology, wafer bonding, SEG, or other appropriate operation.

In one embodiment, a pad layer 304a and a mask layer 304b are formed on the semiconductor substrate 110. The pad layer 304a may be a thin film formed of silicon oxide, for example, by using a thermal oxidation operation. The pad layer 304a may act as an adhesion layer between the semiconductor substrate 110 and the mask layer 304b. The pad layer 304a may also act as an etch stop layer for etching the mask layer 304b. In at least one embodiment, the mask layer 304b is formed of silicon nitride, for example, using low-pressure chemical vapor deposition (LPCVD) or plasma enhanced chemical vapor deposition (PECVD). The mask layer 304b is used as a hard mask during subsequent patterning operations. A photoresist layer 306 is formed on the mask layer 304b and is then patterned by a photolithography patterning operation, forming openings in the photoresist layer 306. The photoresist layer may be removed after patterning of the mask layer 304b and pad layer 304a and before the trench etching.

The photolithography patterning operation may include photoresist coating (e.g., spin-on coating), soft baking, mask aligning, exposing, post-exposure baking, developing, rinsing, drying (e.g., hard baking), other suitable operations, or combinations thereof. Alternatively, the photolithography patterning operation is implemented or replaced by other proper methods such as maskless photolithography, electron-beam writing, direct-writing, and/or ion-beam writing. The photolithography patterning operation yields the photoresist layer that is used as a mask during a trench etching operation.

Figure 4:
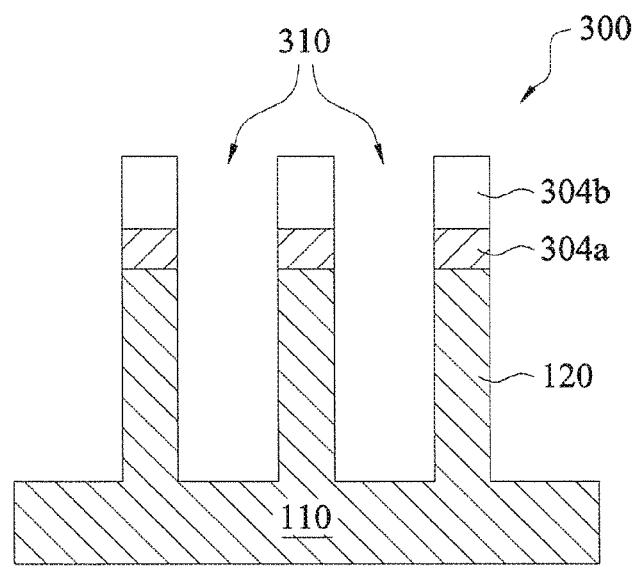

FIG. 4 is a cross-sectional view of the FinFET device 300 at one of various stages of the sequential fabrication process according to an embodiment of the present disclosure. The mask layer 304b and pad layer 304a are etched to expose the underlying semiconductor substrate 110. The exposed semiconductor substrate 110 is then trench-etched to form trenches 310 by using the patterned mask layer 304b and pad layer 304a as a mask.

In the trench etching operation, the substrate 110 may be etched by various methods, including a dry etch, a wet etch, or a combination of dry etch and wet etch. The dry etching operation may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof.

Next, a wet cleaning operation may be performed to remove a native oxide of the semiconductor substrate 110. The cleaning may be performed using dilute hydrofluoric (DHF) acid. Portions of the semiconductor substrate 110 between trenches 310 form semiconductor fins 120. The fins 120 may be arranged in strips (when viewed from the top of the FinFET device 300) parallel to each other, and closely spaced with respect to each other. Each of the fins 120 has a width W and a depth D, and are spaced apart from an adjacent fin by a width S of the trench 310. For example, the width W of the semiconductor fin 120 is in a range of about 3 nm to about 30 nm in some embodiments.

Figure 5:
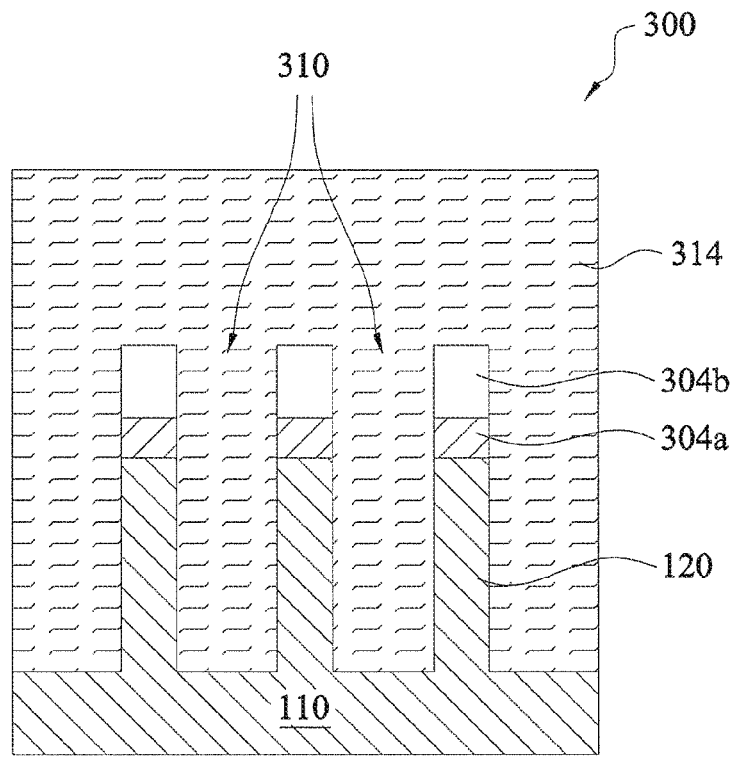

FIG. 5 is a cross-sectional view of the FinFET device 300 at one stage of the sequential fabrication process according to an embodiment of the present disclosure. Trenches 310 are filled with one or more layers of a dielectric material 314. The dielectric material 314 may include silicon oxide. In one or more implementations, the dielectric material 314 is made of, for example, silicon dioxide formed by LPCVD (low pressure chemical vapor deposition), plasma-CVD or flowable CVD. In the flowable CVD, flowable dielectric materials are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal operations are conducted. The flowable film is then cured and annealed.

In some embodiments, other dielectric materials, such as silicon nitride, silicon oxynitride, fluorine-doped silicate glass (FSG), or a low-k dielectric material, are used to form the dielectric material 314. In an embodiment, the dielectric material 314 is formed using a high-density-plasma (HDP) CVD operation, using silane ($SiH_4$) and oxygen ($O_2$) as reacting precursors. In other embodiments, the dielectric material 314 may be formed using a sub-atmospheric CVD (SACVD) operation or high aspect-ratio process (HARP), in which process gases may include tetraethylorthosilicate (TEOS) and/or ozone ($O_3$). In yet other embodiments, the dielectric material 314 may be formed using a spin-on-dielectric (SOD) operation, such as hydrogen silsesquioxane (HSQ) or methyl silsesquioxane (MSQ). In some embodiments, the filled recess region (or the trenches 310) may have a multi-layer structure such as a thermal oxide liner layer filled with silicon nitride or silicon oxide.

Figure 6:
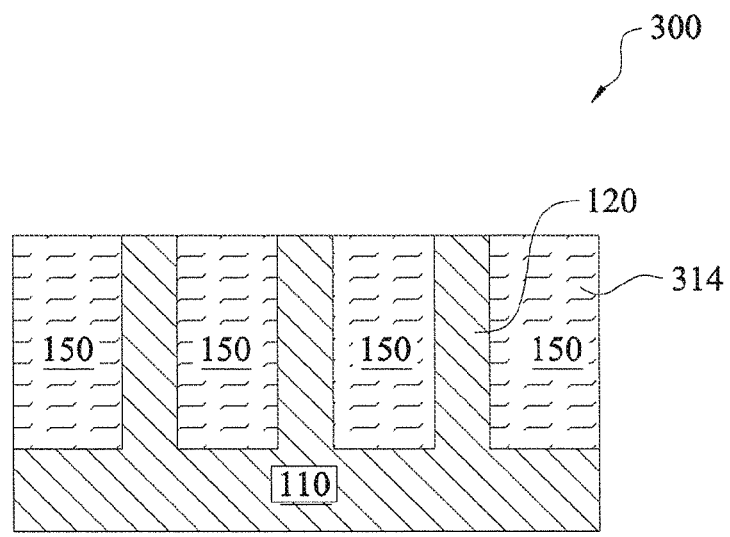

FIG. 6 is a cross-sectional view of the FinFET device 300 at one stage of the fabrication process according to an embodiment of the present disclosure. After the deposition of the dielectric material 314, a chemical mechanical polish (CMP) and/or an etch-back operation are then performed, followed by removal of the mask layer 304b and pad layer 304a. An annealing operation may be performed after the trenches 310 are filled with the dielectric material 314. The annealing operation includes rapid thermal annealing (RTA), laser annealing operations, or other suitable annealing operations.

In one embodiment, the mask layer 304b is formed of silicon nitride such that the mask layer 304b is removed using a wet etching operation using $H_3PO_4$. The pad layer 304a may be removed using dilute HF acid if the pad layer 304a is formed of silicon oxide. The remaining portions of the dielectric material 314 in the trenches 310 are hereinafter referred to as isolation regions 150. In some embodiments, the removal of the mask layer 304b and the pad layer 304a is performed after the recessing of the isolation regions 150, which recessing operation is shown in FIG. 7.

Figure 7:
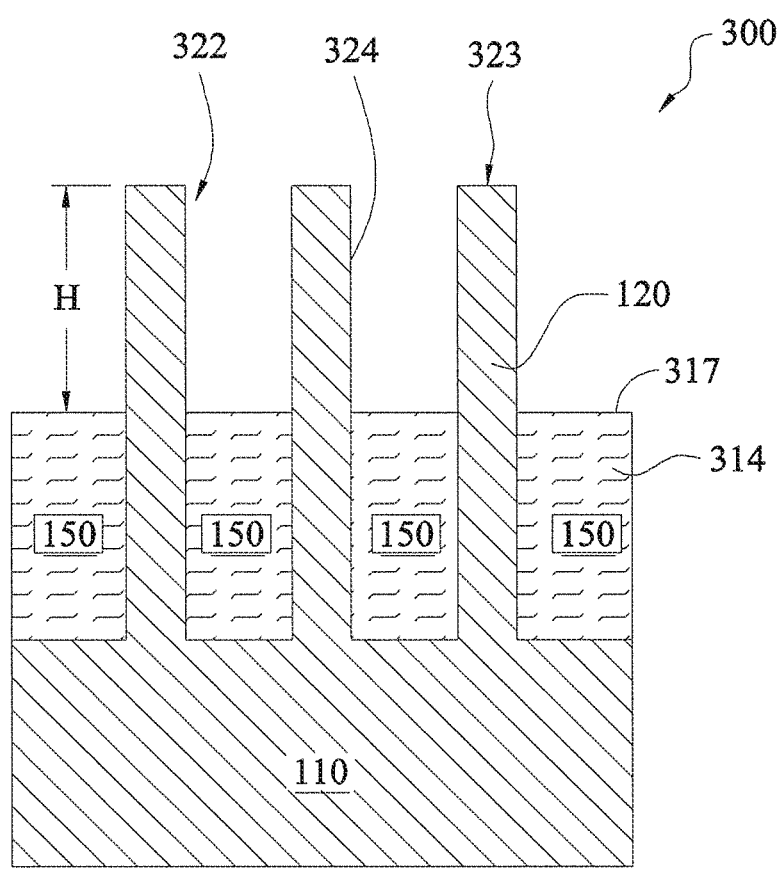

FIG. 7 is a cross-sectional view of the FinFET device 300 at one stage of the fabrication process according to an embodiment of the present disclosure. An etching operation may be performed to etch isolation regions 150 to expose upper portions 322 of the semiconductor fins 120 from the isolation regions 150. The etching operation may include a dry etching operation, wet etching operation, or combination dry and wet etching operations to remove portions of the isolation regions 150. It is understood that the etching operation may be performed as one etching operation or multiple etching operations.

The remaining isolation regions 150 include top surfaces 317. Further, the upper portions 322 of the semiconductor fins 120 protruding over the top surfaces 317 of the remaining isolation regions 150 are used to form an active area, such as a channel region, of the FinFET device 300. The upper portions 322 of the semiconductor fins 120 may include top surfaces 323 and sidewalls 324. A height H of the upper portions 322 of the semiconductor fins 120 from the top surface 317 of the isolation regions 150 may be in a range of about 6 nm to about 300 nm. In some embodiments, the height H is greater than 300 nm or smaller than 6 nm. For simplicity, the upper portion 322 of the semiconductor fin 120 protruding from isolation regions 150 is hereinafter referred to as the fin channel to illustrate each upper portion of the semiconductor fin 120, in which the top surfaces 317 of the isolation regions 150 are lower than the top surface 323 of the semiconductor fin 120.

Figure 8:
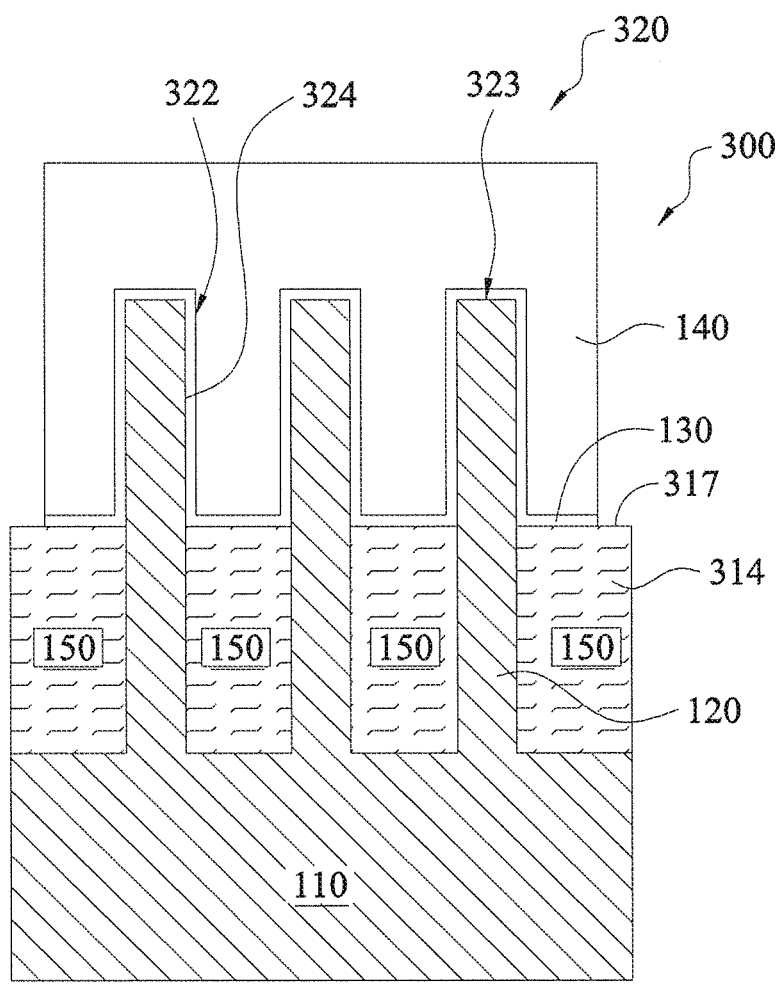

As shown in FIG. 8, a gate stack 320 is formed over the substrate 110 over the top surface 323 and sidewalls 324 of the semiconductor fin 120, and extending to the top surfaces 317 of the first isolation region 150a and the second isolation region 150b. The gate stack 320 includes a gate dielectric layer 130 and a gate electrode layer 140 over the gate dielectric layer 130.

The gate dielectric layer 130 is formed to cover the top surface 323 and sidewalls 324 of at least a portion of the channel region of the semiconductor fins 120. In some embodiments, the gate dielectric layer 130 includes one or more layers of silicon oxide, silicon nitride, silicon oxy-nitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 130 may be formed using a suitable operation such as atomic layer deposition (ALD), chemical vapor deposition (CVD), physical vapor deposition (PVD), thermal oxidation, UV-ozone oxidation, or combinations thereof. The gate dielectric layer 130 may further include an interfacial layer (not shown) to reduce damage between the gate dielectric layer 130 and the fin 120. The interfacial layer may include silicon oxide.

The gate electrode layer 140 is then formed on the gate dielectric layer 130. In at least one embodiment, the gate electrode layer 140 covers the upper portion 322 of more than one semiconductor fin 120, so that the resulting n-type FinFET device includes more than one fin structure. In some alternative embodiments, each of the upper portions 322 of the semiconductor fins 120 may be used to form a separate n-type FinFET device. The gate electrode layer 140 may include a single layer or a multilayer structure. The gate electrode layer 140 may include polysilicon. Further, the gate electrode layer 140 may be doped polysilicon with the uniform or non-uniform doping. In some alternative embodiments, the gate electrode layer 140 may include a metal such as Al, Cu, W, Ti, Ta, TiN, TiAl, TiAlN, TaN, NiSi, CoSi, other conductive materials with a work function compatible with the substrate material, or combinations thereof. The gate electrode layer 140 may be formed using a suitable operation such as ALD, CVD, PVD, plating, or combinations thereof. In some embodiments, a hard mask layer 332, which has been used to pattern a polysilicon layer, is formed on the gate stack 320.

In FIGS. 9-19, a semiconductor device having one or more p-type FinFET structures (e.g., p-type FinFET device 904) and one or more n-type FinFET structures (e.g., n-type FinFET device 902) is illustrated. In the present disclosure, the FinFET device 300 is depicted as an n-type FinFET structure but can be configured as another type of FinFET structure. For purposes of simplification, the subject matter in FIGS. 9-19 will be discussed in reference to the n-type FinFET device 902 with additional reference made to the p-type FinFET device 904.

Figure 9:
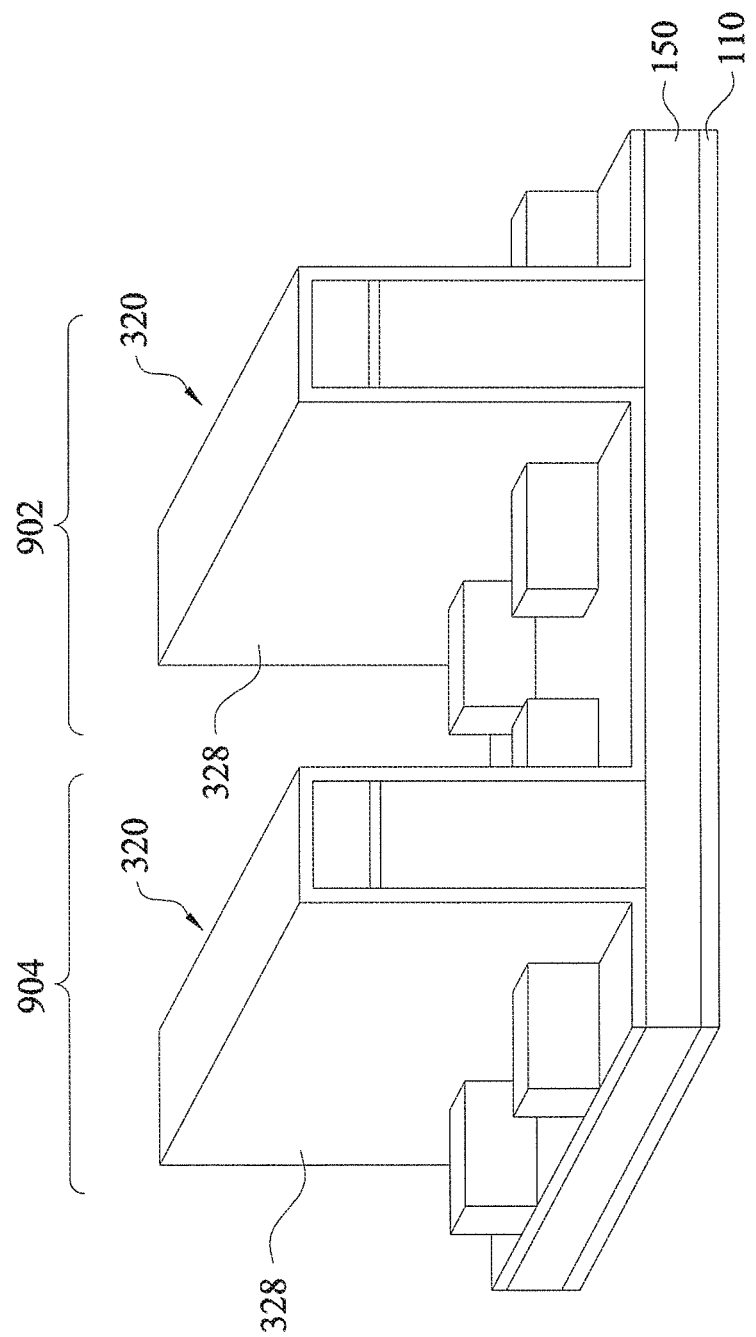
FIGS. 9-14 illustrate perspective views of operations in the sequential fabrication process of a FinFET structure according to embodiments of the present disclosure.

FIG. 9 is a perspective view of the n-type FinFET device 902 and the p-type FinFET device 904 at one stage of the fabrication process according to an embodiment of the disclosure. In FIG. 9, the n-type FinFET device 902 is covered by sidewall spacer material 328 made of a dielectric layer along the vertical side of the gate stack 320. In some embodiments, the dielectric layer includes one or more layers of silicon oxide, silicon nitride, silicon oxy-nitride, or other suitable material. The dielectric layer may include a single layer or multilayer structure. A blanket layer of the dielectric layer may be formed by CVD, PVD, ALD, or other suitable technique. Then, an anisotropic etching and/or etch-back operation is performed on the dielectric layer to form a pair of sidewall spacers 328 on two sides of the gate stack 320. During the formation of the gate stack 320, various cleaning/etching operations, which etch the STI regions 150a and 150b, are performed.

Figure 10:
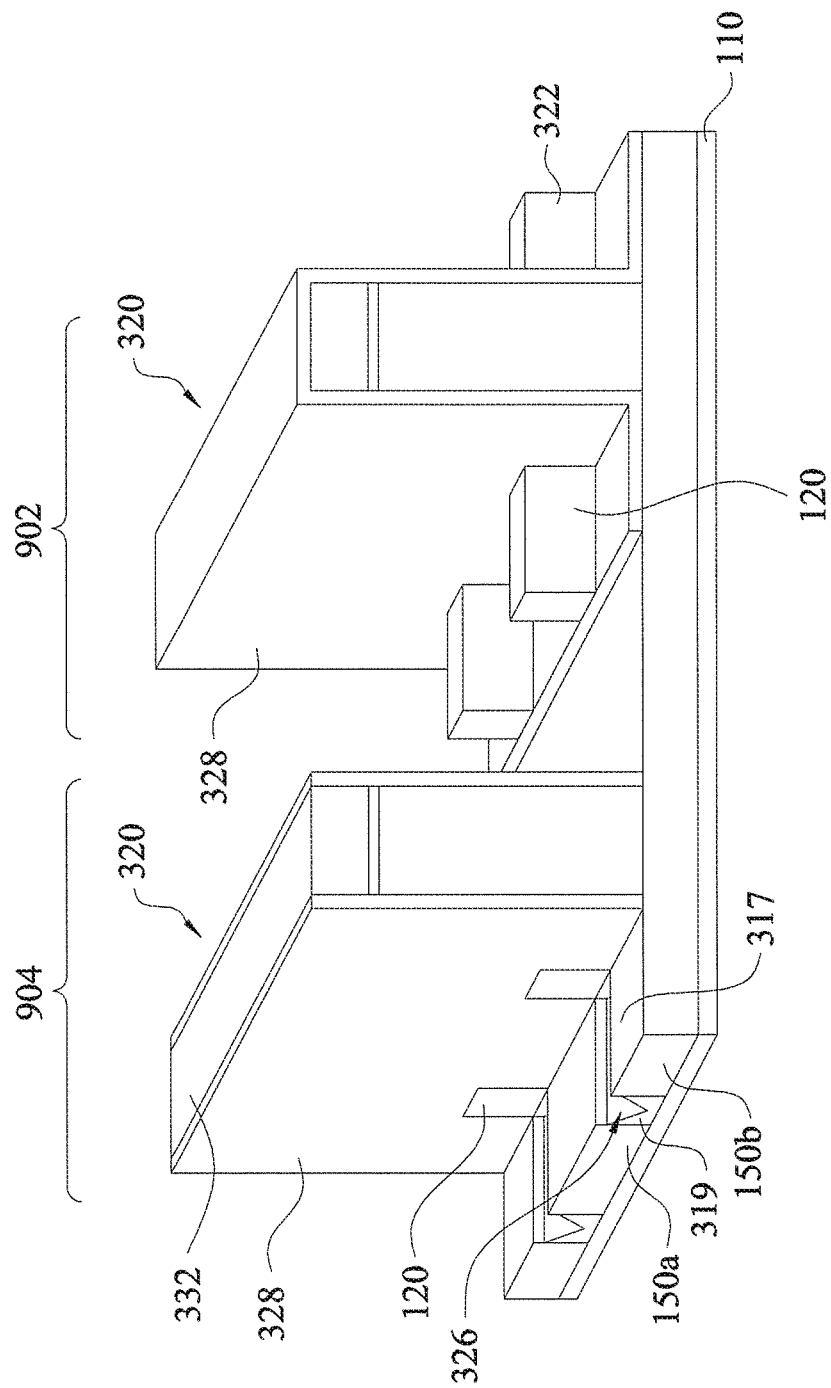

FIG. 10 is a perspective view of the n-type FinFET device 902 and the p-type FinFET device 904 at one stage of the fabrication process according to an embodiment of the disclosure. The portions of the semiconductor fin 120 not covered by the gate stack 320 (FIG. 8) and sidewall spacers 328 (FIG. 9) formed thereover are recessed to form a recessed portions 326 of the semiconductor fin 120 having a top surfaces 319 below the top surfaces 317 of the first and second isolation regions 150a, 150b. In one embodiment, using the sidewall spacers 328 as hard masks, a biased etching operation is performed to recess top surfaces 319 of the upper portions 322 that are unprotected or exposed to form the recessed portions 326 of the semiconductor fin 120. In an embodiment, the etching operation is performed using HBr and/or $Cl_2$ as etch gases.

Figure 11:
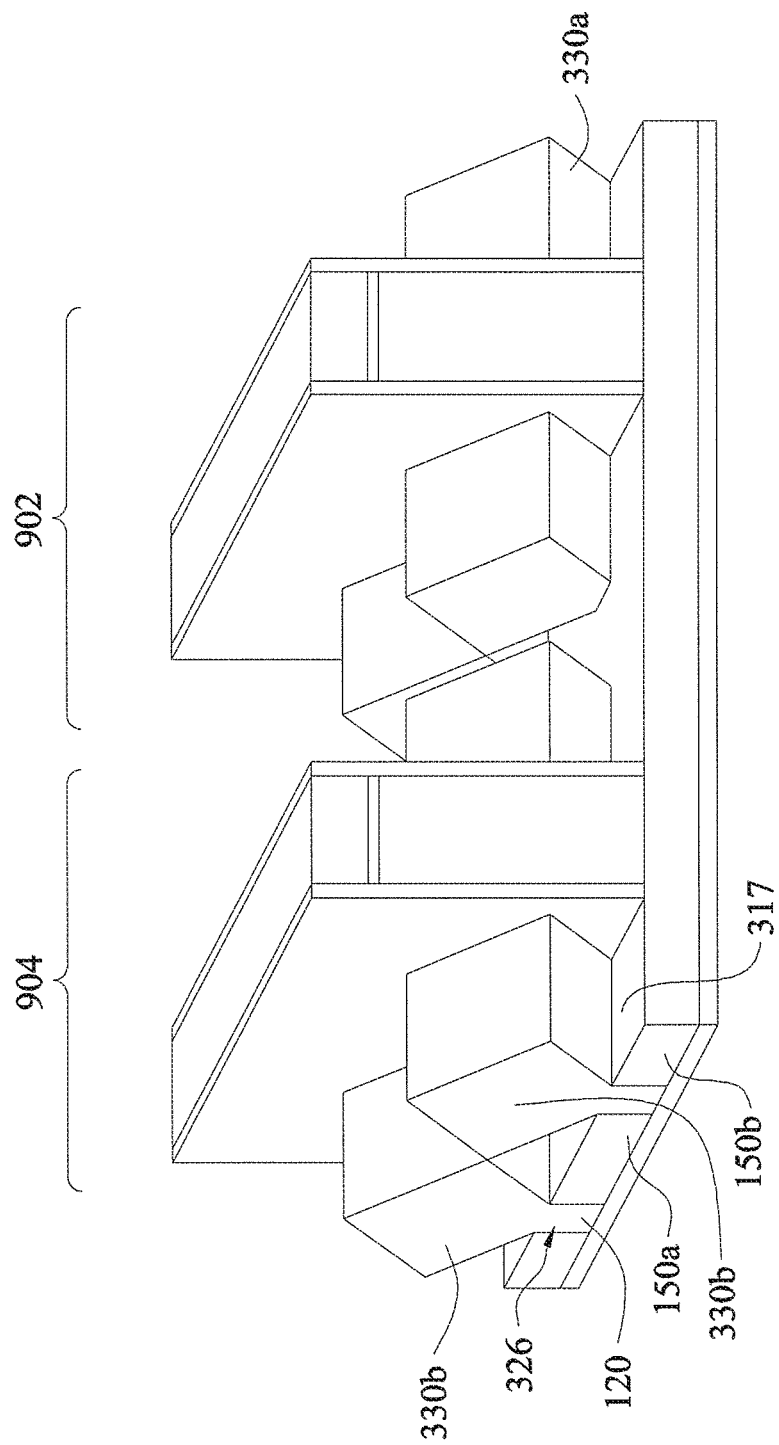

FIG. 11 is a perspective view of the n-type FinFET device 902 and the p-type FinFET device 904 at one stage of the fabrication process according to an embodiment of the disclosure. The structures depicted in FIG. 11 are produced by selectively growing a strained material 330a, 330b over the recessed portion 326 of the semiconductor fin 120 and extending over the top surfaces 317 of the first and second isolation regions 150a, 150b. Since the lattice constant of the strained material 330a, 330b is different from the channel region of the semiconductor fin 120, the channel region of the semiconductor fin 120 is strained or stressed to enhance carrier mobility and performance of the device. Although the strained material 330a, 330b is formed separately with respect to each fin in FIG. 11, the strained material 330a, 330b, of adjacent fins may be connected.

In at least one embodiment, strained material 330a such as silicon carbon (SiC) and/or silicon phosphide (SiP), is epitaxially grown by a LPCVD operation to form the source and drain regions of the n-type FinFET device 902. In at least another embodiment, strained material 330b, such as silicon germanium (SiGe), is epitaxially grown by a LPCVD operation to form the source and drain regions of the p-type FinFET device 904.

In FIGS. 10 and 11, the n-type FinFET 902 is covered by, for example, silicon nitride such that the n-type FinFET 902 is protected during the recess and source/drain formation in the p-type FinFET 904. After the strained material 330b is formed for the p-type FinFET 904, the p-type FinFET is covered by silicon nitride layer, and then similar operations including recess formation and strain material formation are performed on the n-type FinFET 902.

Figure 12:
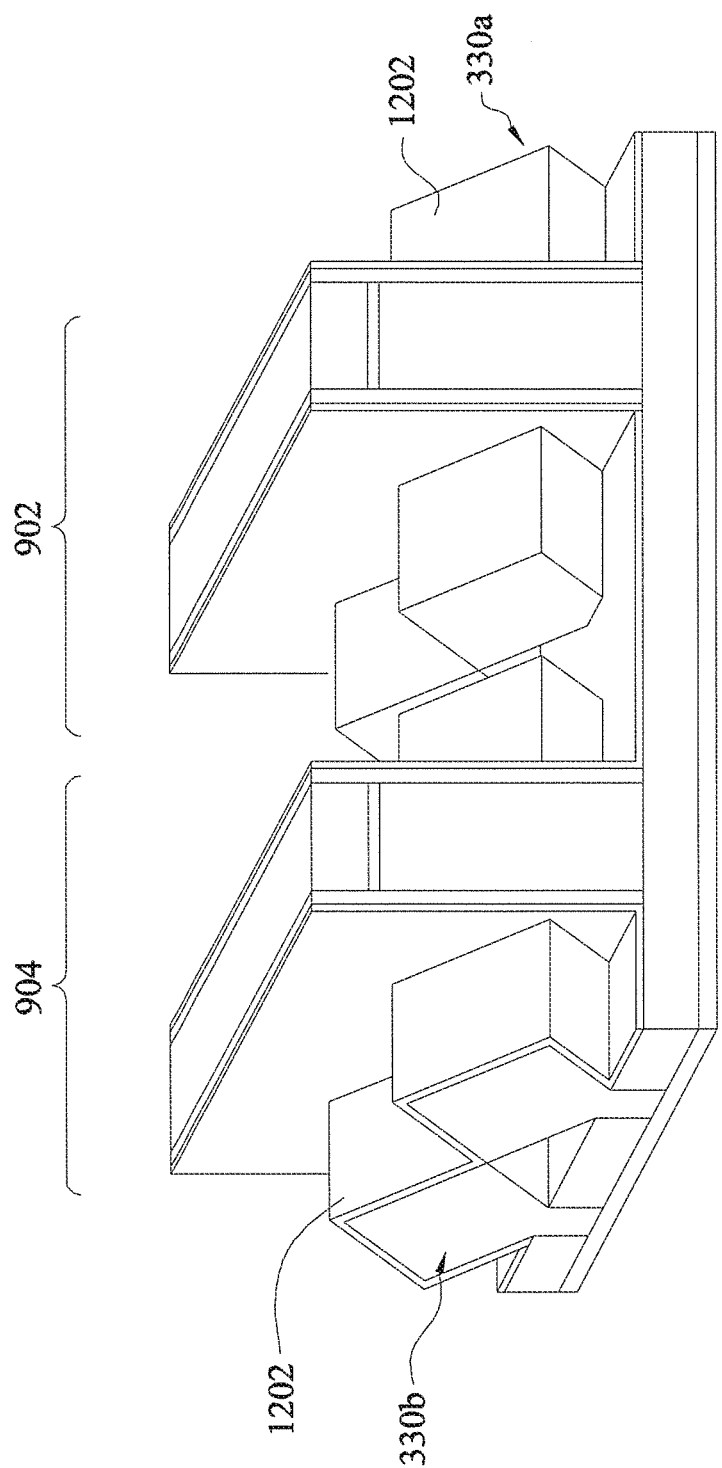

FIG. 12 is a perspective view of the n-type FinFET device 902 and the p-type FinFET device 904 at one stage of the fabrication process according to an embodiment of the disclosure. After forming the source/drain regions (e.g., the strain materials 330a, 330b), an operation of depositing a contact etch stop layer (CESL) 1202 is performed. In this example, the CESL 1202 may be applied as a uniform layer over the n-type FinFET device 902 and the p-type FinFET device 904.

Figure 13:
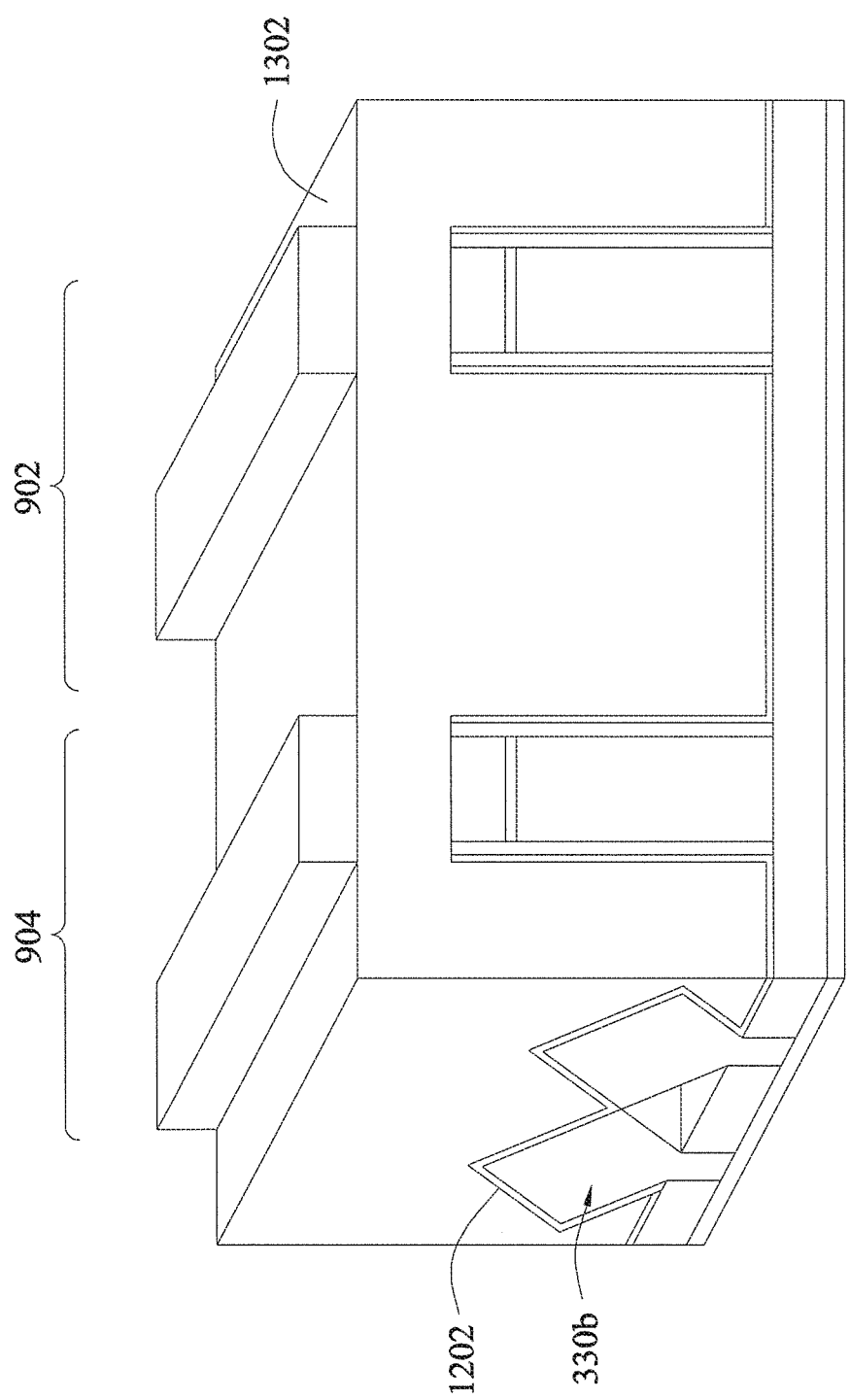

FIG. 13 is a perspective view of the n-type FinFET device 902 and the p-type FinFET device 904 at one stage of fabrication according to an embodiment of the disclosure. The CESL forming operation (see, FIG. 12) is followed by an operation of depositing an interlayer dielectric (ILD) layer 1302. The ILD layer 1302 is deposited by a suitable technique, such as CVD. In this example, the ILD layer 1302 may be applied as a uniform layer over the n-type FinFET device 902 and the p-type FinFET device 904. The ILD layer 1302 includes a dielectric material, such as one or more layers of silicon oxide, silicon nitride, a low-k dielectric material or a combination thereof.

Figure 14:
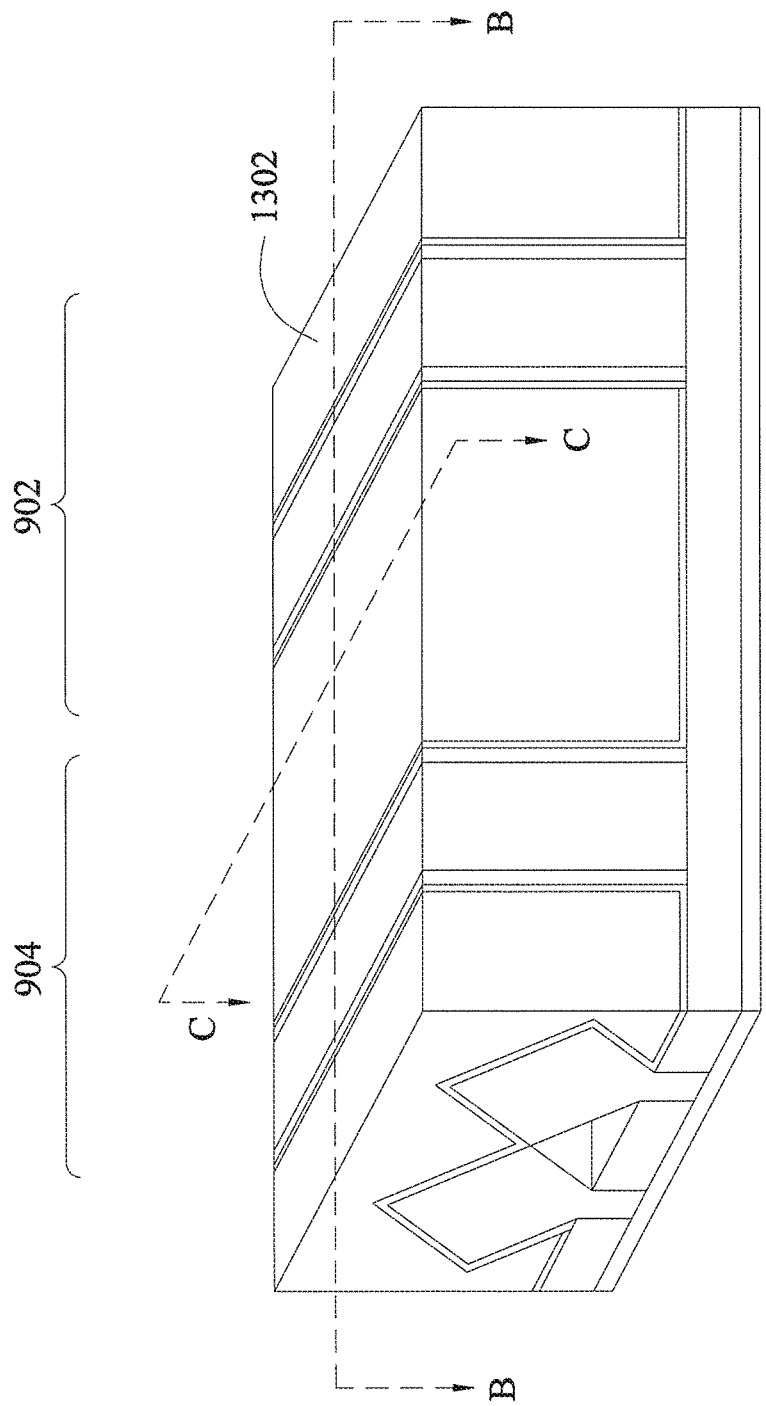

FIG. 14 is a perspective view of the n-type FinFET device 902 and the p-type FinFET device 904 at one stage of the fabrication process according to an embodiment of the disclosure. The ILD layer 1302 is subsequently planarized by a CMP operation, resulting in the structure shown in FIG. 14.

In order to use a high-k dielectric layer and a metal gate, a gate replacement technology is employed. In the gate replacement technology, the gate dielectric layer 130 and the gate electrode 140 are a "dummy" gate dielectric layer and a "dummy" gate electrode, which are removed and replaced with a high-k dielectric layer and a metal gate electrode. After patterning the dummy gate, the next operations are the same or similar to a STI first/gate first method until after the operation of CMP of the ILD layer 1302.

Figure 15:
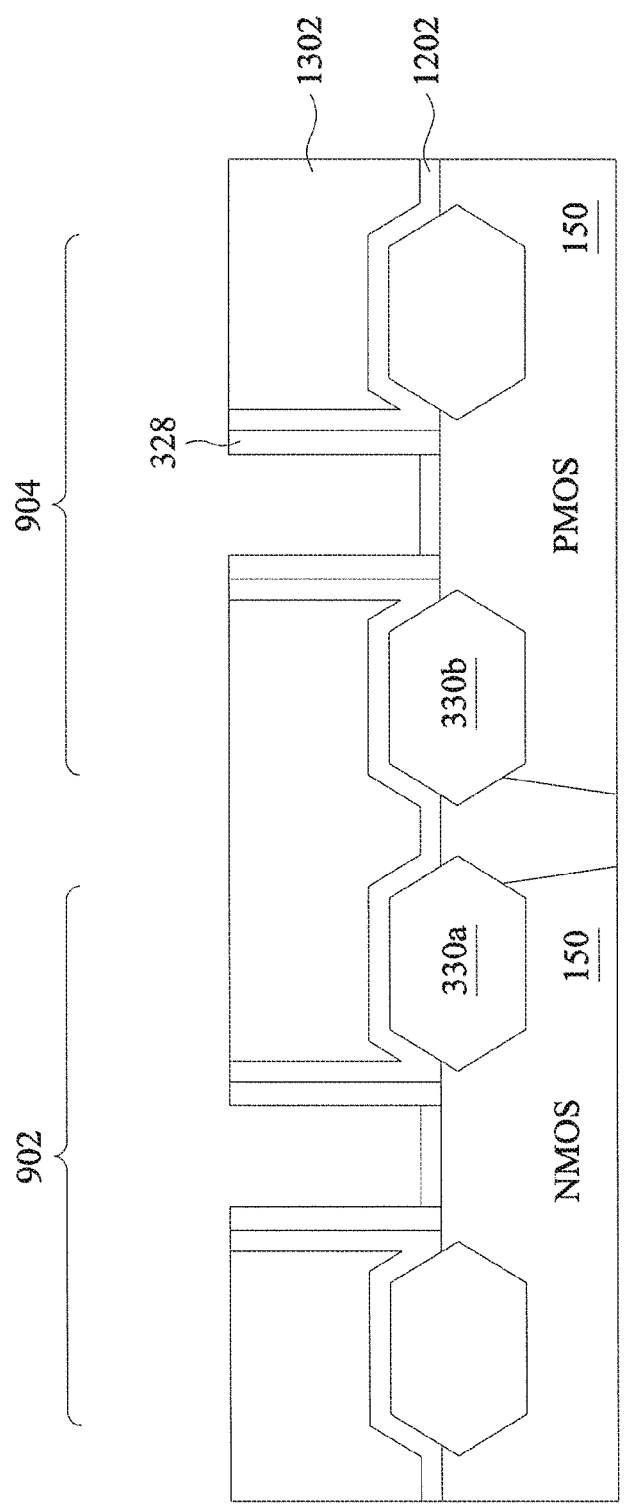
FIGS. 15-17 illustrate cross-sectional views of operations in the sequential fabrication process of a metal gate of a FinFET structure according to embodiments of the present disclosure.

FIG. 15 is a cross-sectional view of the n-type FinFET device 902 and the p-type FinFET device 904 at one stage of the fabrication process according to an embodiment of the disclosure. After CMP of the ILD layer 1302, an operation of removing the dummy gate 140 and an operation of removing the dummy gate dielectric 130 are performed. The dummy gate and dummy gate dielectric are removed using suitable etching operations.

Figure 16:
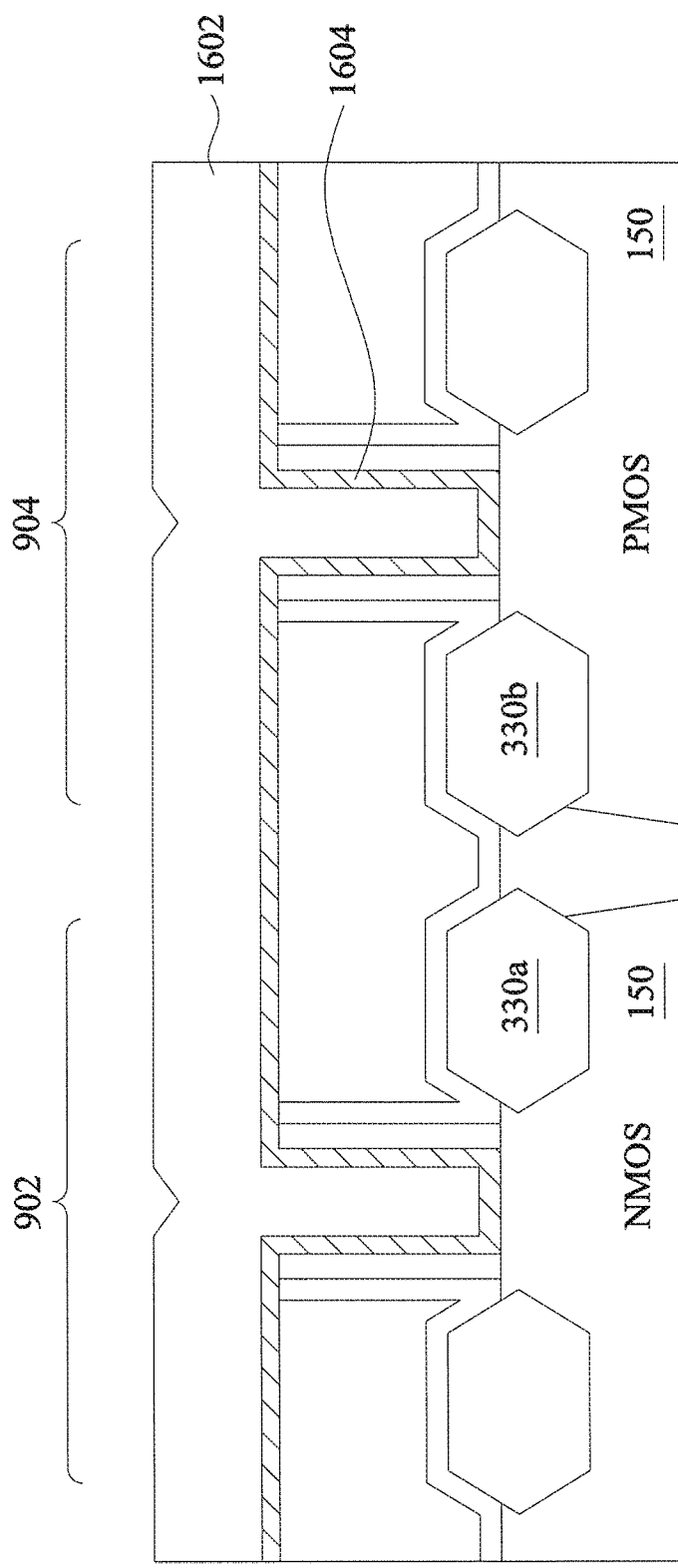

FIG. 16 is a cross-sectional view of the n-type FinFET device 902 and the p-type FinFET device 904 at one stage of the fabrication process according to an embodiment of the present disclosure. Subsequently, operations of depositing a high-k gate dielectric 1604 and depositing a metal gate layer 1602 on the high-k gate dielectric 1604 occurs. According to embodiments of the disclosure, the high-k gate dielectric 1604 includes one or more layers of metal oxides. Examples of metal oxides used for high-k dielectrics include oxides of LI, Be, Mg, Ca, Sr, Sc, Y, Zr, HF, Al, La, Ce, Pr, Nd, Sm, Eu, Gd, Tb, Dy, Ho, Er, Tm, Yb, Lu, and/or mixtures thereof. In certain embodiments, the high-k dielectric includes: $HfO_2$, HfSiO, HfSiON, HfTaO, HfTiO, HfZrO, $ZrO_2$, $Al_2O_3$, and hafnium dioxide-alumina ($HfO_2$—$Al_2O_3$) alloy. The gate dielectric layer may be made by CVD, PVD, or ALD. The metal gate layer 1602 may include one or more layers of W, Ti, TiN, titanium-aluminum alloy, Al, AlN, Ta, TaN, TaC, TaCN, TaSi, NiSi, CoSi, and other conductive metals. In some embodiments, one or more work function adjustment layers (not shown) are interposed between the gate dielectric layer and the metal gate electrodes 70. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-type FET, one or more of TaN, TaAlC, TiN, TiC, Co, TiAl, HfTi, TiSi and TaSi is used as the work function adjustment layer, and for the p-type FET, one or more of TiAlC, Al, TiAl, TaN, TaAlC, TiN, TiC and Co is used as the work function adjustment layer.

Figure 17:
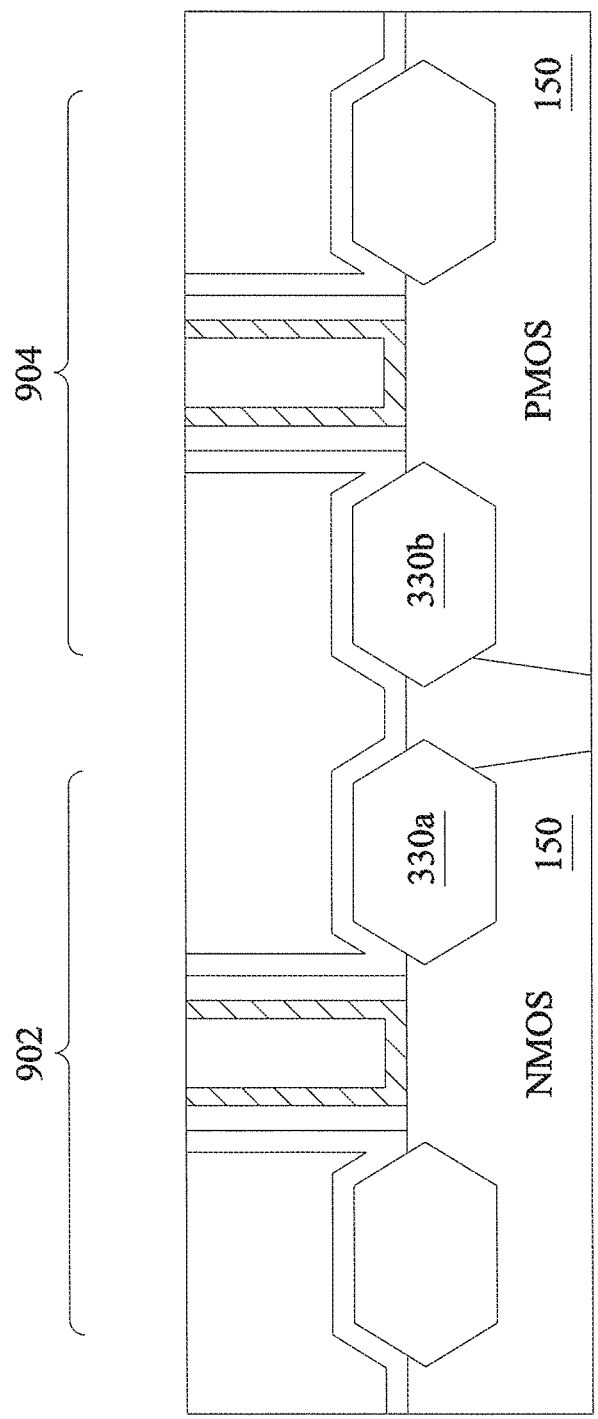

FIG. 17 is a cross-sectional view of the n-type FinFET device 902 and the p-type FinFET device 904 at one stage of the fabrication process according to an embodiment of the disclosure. The metal gate layer 1602 is subsequently planarized by a CMP operation, resulting in the structure shown in FIG. 17.

In certain embodiments, the metal gate electrodes are recessed and cap insulating layers. The cap insulating layers (not shown) may include one or more layers of insulating material, such as $SiO_2$, SiN, SiON, SiCN or SiOCN. The cap insulating layers are formed by depositing a blanket layer of insulating material by CVD and performing a planarization operation (e.g., CMP).

Figure 18A:
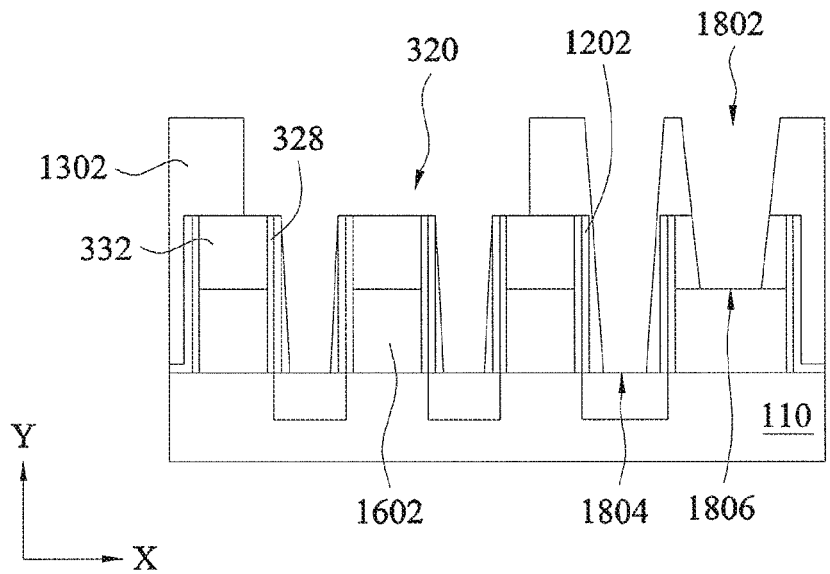
FIGS. 18A-20B illustrate cross-sectional views of operations in the sequential fabrication process of a FinFET structure without forming a carbon-based layer.
Figure 18B:
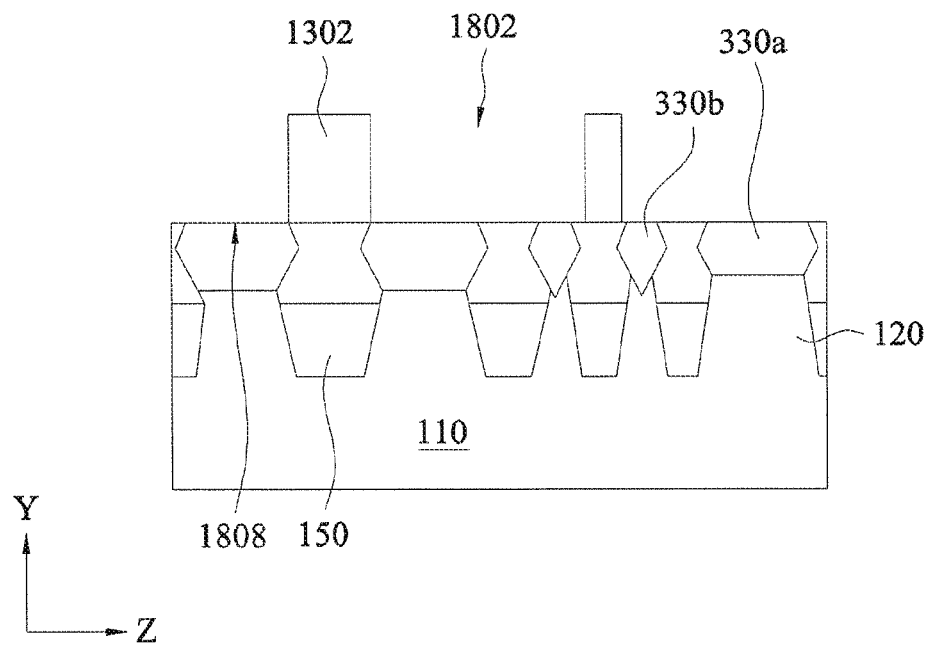
Figure 18C:
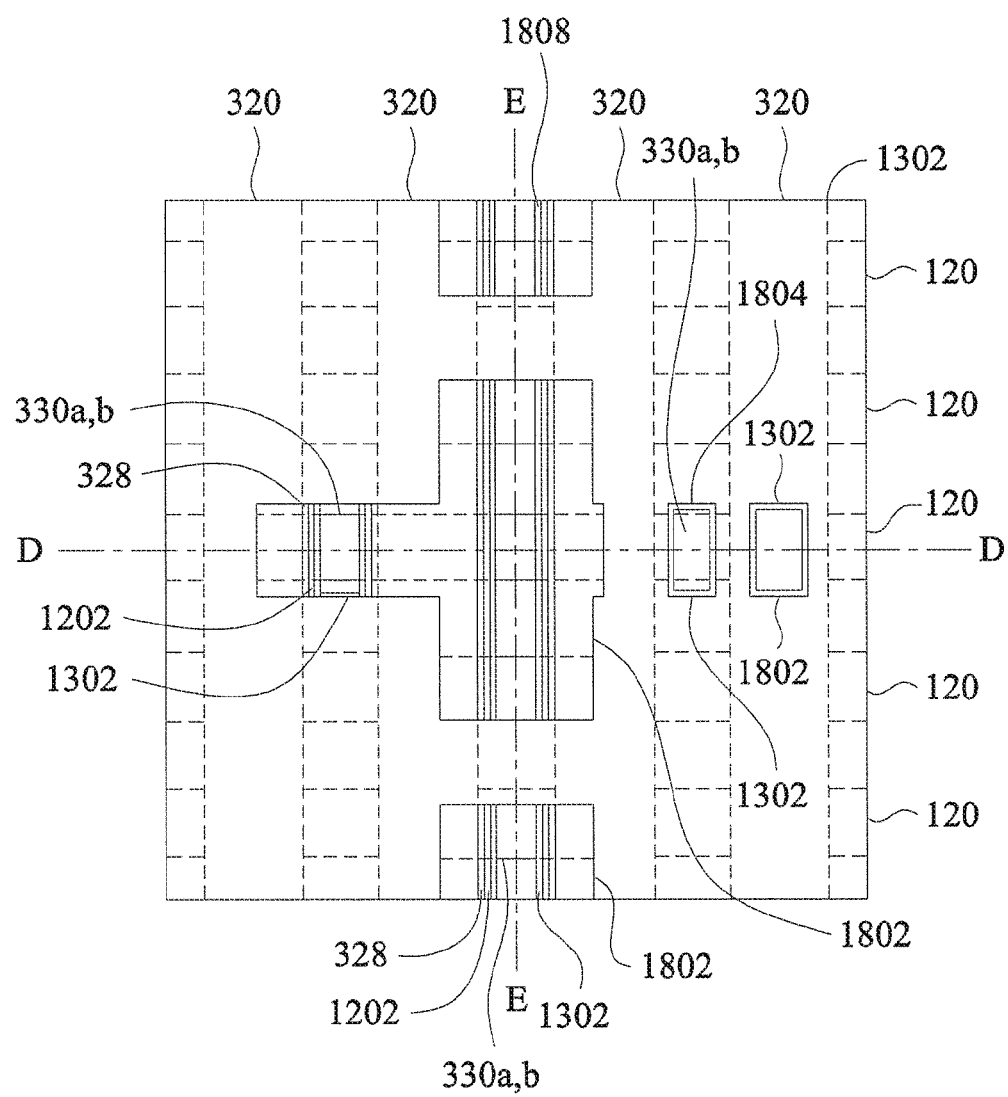

After formation of the high-k/metal gate electrode structure, contact openings to the source/drain electrodes are patterned (see FIGS. 18A-18C).

In certain embodiments of the disclosure, an STI first/gate last method is implemented. Many of the operations in this embodiment are the same or similar to the operations of a STI first/gate first method. The methods are the same through the operation of removing a portion of the STI regions. In other embodiments, a method for fabricating the FinFET device 300 utilizes an EPI first/gate first method or EPI first/gate last method. In the EPI first methods, an epitaxial layer is formed on the substrate 110, and then the epitaxial layer is subsequently patterned to form fins (e.g., the semiconductor fins 120). Many of the operations in the EPI first embodiments are the same or similar to the operations of the STI first methods.

Subsequent processing according to embodiments of the present disclosure may also form various contacts/vias/lines and multilayer interconnect features (e.g., metal layers and interlayer dielectrics) on the semiconductor substrate 110, configured to connect the various features or structures of the FinFET device 300. For example, a multilayer interconnection includes vertical interconnects, such as conventional vias or contacts, and horizontal interconnects, such as metal lines.

The contacts to the source/drain electrodes may be formed by patterning the ILD layer 1302, such as a photolithographic operation to form openings exposing the strain material 330a, 330b. A suitable conductive material, such as copper, tungsten, nickel, titanium, or the like, is deposited in the openings. In some embodiments, a metal silicide is formed at the conductive material and source/drain interface to improve conductivity at the interface. In one example, a damascene and/or dual damascene operation is used to form copper-based multilayer interconnection structures. In another embodiment, tungsten is used to form tungsten plugs in the openings.

FIG. 18A is a cross-sectional view of the FinFET device 300 taken along line D-D of FIG. 18C and FIG. 18B is a cross-sectional view of the FinFET device 300 taken along the direction of line E-E of FIG. 18C, orthogonal to the cross-sectional view of FIG. 18A, at one stage of a first sequential fabrication process according to an embodiment of the present disclosure. In FIG. 18A, the cross-sectional view illustrates cross-sections of the gate stacks 320, whereas the cross-sectional view in FIG. 18B illustrates cross-sections of the semiconductor fins 120 and the strain materials 330a, 330b as epitaxially-grown structures.

FIG. 18C, is a plan view showing exemplary openings 1802, 1804, 1808 in the ILD layer 1302. Dashed lines illustrate the outlines of the gate stacks 320 and fins 120 where covered by only one overlying layer (either ILD layer 1302 or gate stack 320). The outlines of the fins 120 are not shown where they are covered by two overlying layers (both ILD layer 1302 and gate stack 320). The sidewall spacers 328 and CESL 1202 are only shown in the openings 1802, 1804, 1808.

After CMP of the metal gate layer 1602, an operation of removing portions of the ILD layer 1302 is performed, thereby forming contact openings 1802. The portions of the ILD layer 1302 are removed using suitable etching operations. The ILD layer 1302 is etched by a dry etch operation in some embodiments, or by a wet etch operation in other embodiments.

In FIG. 18A, the ILD layer 1302 is etched down to a top surface of the CESL 1202 within a first opening 1804, for example. Within a second opening 1806, the ILD layer 1302 is etched down to a top surface of the metal gate layer 1602 of the gate stack 320. In this embodiment, the base of the second opening 1806 is higher relative to the base of the first opening 1804 along the y-axis. In some aspects, the contact openings 1802 within the ILD layer 1302 have a downward tapered shape. In one embodiment, the openings 1802 are etched vertically from the top surface of the ILD layer 1302 to the top of the gate stack 320 such that the openings 1802 become narrower from the top of the gate stack 320 towards the base of the openings 1802. In other embodiments, the openings 1802 become narrower from the top surface of the ILD layer 1302 directly towards the base of the openings 1802. In FIG. 18B, the ILD layer 1302 is etched down to a plane coplanar with a top surface of the strain material 330a within a third opening 1808, for example. Portions of the ILD layer 1302 remain raised above the top surface of the strain material 330a, 330b, resulting from the dry etch operation performed on the ILD layer 1302.

Figure 19A:
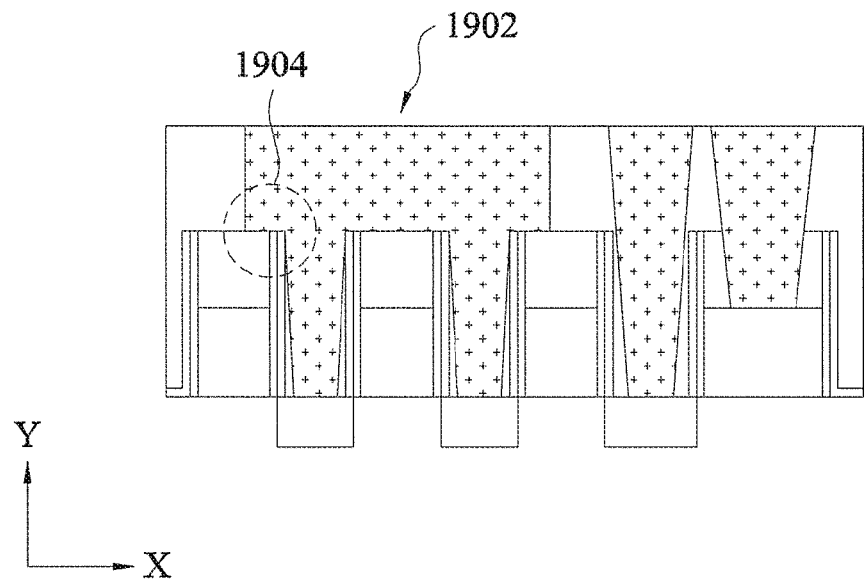
Figure 19B:
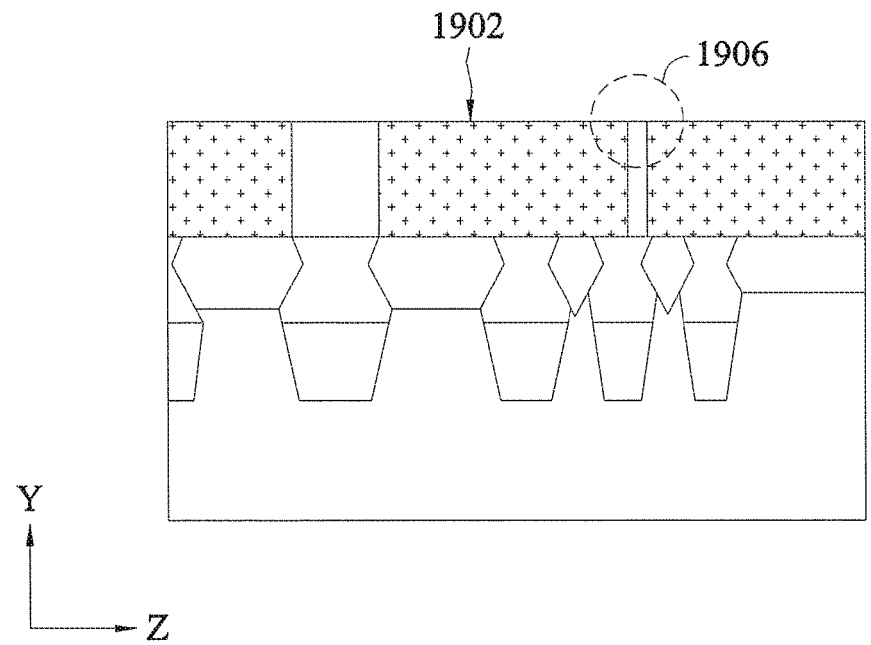

FIG. 19A is a cross-sectional view of the FinFET device 300 and FIG. 19B is a cross-sectional view of the FinFET device 300, orthogonal to the cross-sectional view of FIG. 19A. In FIG. 19A, a pre-clean operation is performed subsequent to the etch operation of forming the contact openings 1802. Such a pre-clean operation is beneficial in (1) removing any oxidation ($SiO_x$) that has grown in the contact area of the wafer after the formation of contact opening 1802 and (2) further etching any silicon oxide from the ILD layer 1302 that may have been unintentionally left in the contact opening 1802 after the contact formation step (see FIGS. 18A, 18B). In the pre-clean operation, one or more layers of a pre-clean material 1902, such as a metal silicide is disposed within the contact openings 1802. Suitable metal silicides include nickel silicide, cobalt silicide, tungsten silicide, tantalum silicide, and titanium silicide. In other embodiments, other pre-clean materials suitable for pre-cleaning the contact openings 1802 may be implemented. The pre-clean operation may be performed at a temperature of about 25° C. to about 150° C., or at a temperature in a range of about 50° C. to about 75° C. in other embodiments.

As shown in FIG. 19A, the sidewall spacers 328 and the CESL 1202 may be damaged by the pre-clean material 1902. In this embodiment, the pre-clean material 1902 may etch away a portion of the sidewall spacers 328 and the CESL 1202 more than intended such that a portion of the metal gate layer 1602 may become exposed at region 1904, resulting in material thickness loss of the sidewall spacers 328. For example, the original thickness of the sidewall spacer 328 at the region 1904 may be about 7.0 nm and the thickness of the sidewall spacer material 328 after the pre-clean operation may be about 2.6 nm, thereby resulting in a spacer loss of about 4.4 nm. Similarly in FIG. 19B, the pre-clean material 1902 may etch through a relatively thin column portion of the ILD layer 1302 at region 1906 more than intended such that contact openings 1802 on opposite sides of the column portion are exposed through the passage, resulting in lateral loss of the ILD layer 1302. For example, the original width of the ILD layer 1302 column portion at the region 1906 may be about 35.0 nm and the width of the ILD layer 1302 column portion after the pre-clean operation may be about 18.6 nm, thereby resulting in a lateral loss of about 16.4 nm.

The pre-clean material 1902 may be removed by a suitable etchant that is selective to the pre-clean material 1902. For example, when the pre-clean material 1902 is composed of a metal silicide an acidic etchant can be used to remove the pre-clean material 1902. In certain embodiments, the pre-clean material 1902 is removed by using one or more of nitric acid, hydrofluoric acid, sulfuric acid, phosphoric acid, and hydrochloric acid.

Figure 20A:
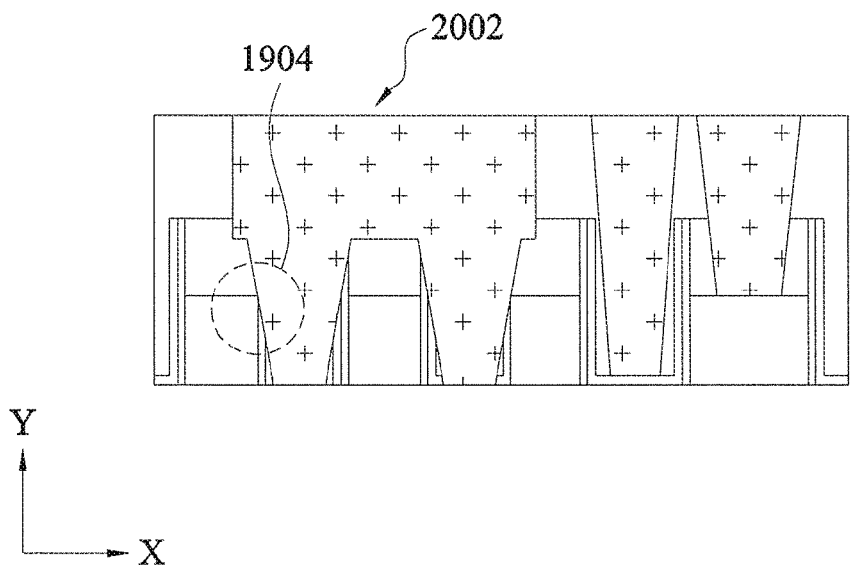
Figure 20B:
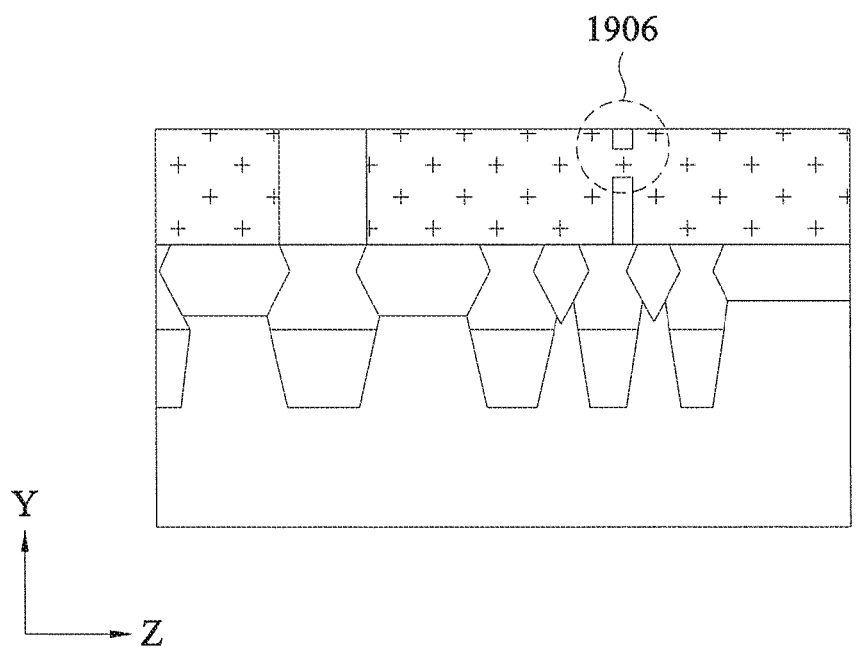

FIG. 20A is a cross-sectional view of the FinFET device 300 and FIG. 20B is a cross-sectional view of the FinFET device 300, orthogonal to the cross-sectional view of FIG. 20A, at one stage of a fabrication process according to an embodiment of the disclosure. After removal of the pre-clean material 1902, an operation of depositing an interconnect layer 2002 may be performed. In some aspects, the interconnect layer 2002 serves as a contact plug to interconnect the FinFET device 300 to upper wiring layers (not shown). A suitable conductive material, such as copper, tungsten, nickel, titanium, or the like, is deposited within the contact openings 1802. For example, tungsten may be used to form tungsten plugs in the contact openings 1802. The interconnect layer 2002 may be formed by CVD, PVD, or plating.

In FIG. 20A, an electrical current path from a contact layer (or plug) formed within the contact opening 1802 to the metal gate layer 1602 is formed due to the damage caused to the sidewall spacers 328 by the pre-clean material 1902, thus causing an electrical short (referred to as a metal-gate-to-contact short) at the region 1904. In this embodiment, the damaged portion of the sidewall spacers 328 enabled the contact layer material 2002 to make unintended contact with the exposed metal gate layering 1602 within the gate stack 320. In FIG. 20B, an electrical current path is formed from a first contact layer region through the thin column of the ILD layer 1302 to a second contact layer region due to damage to the remaining column portion of the ILD layer 1302 caused by the pre-clean material 1902, thus causing an electrical short (referred to as a contact-to-contact short) at the region 1906. In this embodiment, the damaged portion of the ILD layer 1302 enabled contact layer material to fill the passage, thereby creating an unintended current path between adjacent contact layers.

As noted in FIGS. 18A-20B, the sidewall spacer material 329 and/or the ILD layer 1302 may be damaged by the pre-clean material 1902 applied during the pre-clean operation (see FIG. 19) such that such damage induces formation of metal-gate-to-contact shorts and/or contact-to-contact shots. Gate structure spacers (e.g., sidewall spacers 328) and ILD layering (e.g., the ILD layer 1302) are difficult to sustain due to significant etching and/or cleaning losses for high-aspect-ratio contact holes (or openings). In this regard, these unintended shorts become more prevalent as device densities continue to increase. As a result, current leakage during non-operational modes of a device may increase due to the shorts, thereby degrading device performance.

The present disclosure provides for the reduction in spacer loss and/or oxide loss due to pre-clean operations by selectively depositing a non-permanent spacer material with an etching resistance to protect vulnerable spacer and/or oxide layers from such pre-clean materials, thus preventing potential formation of metal-gate-to-contact shorts and/or contact-to-contact shorts in subsequent processing operations. The deposition of such non-permanent spacer material may be selectively applied on etched areas by gaseous reaction with oxide-based and/or nitride-based substrates (and not with native silicon substrates).

Figure 21A:
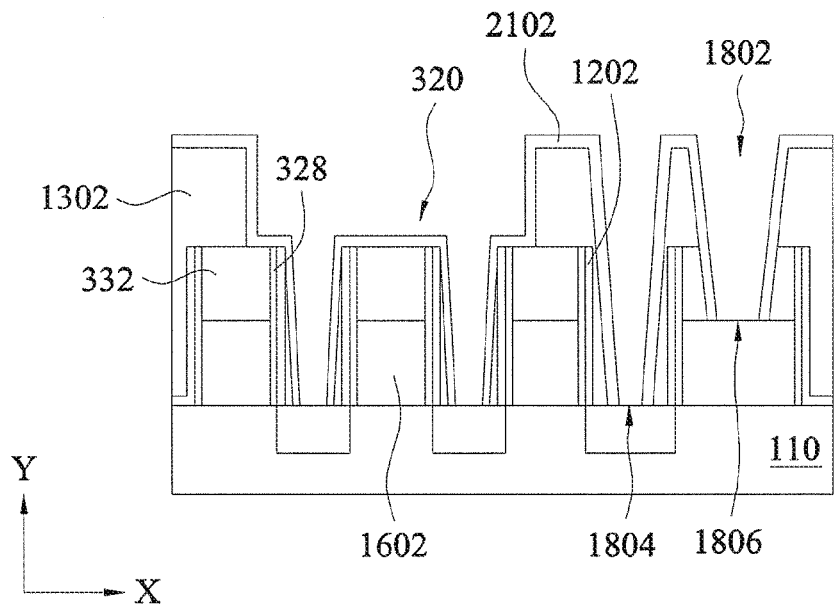
FIGS. 21A-23B illustrate cross-sectional views of operations in the sequential fabrication process of a FinFET structure including forming a carbon-based layer according to embodiments of the present disclosure.
Figure 21B:
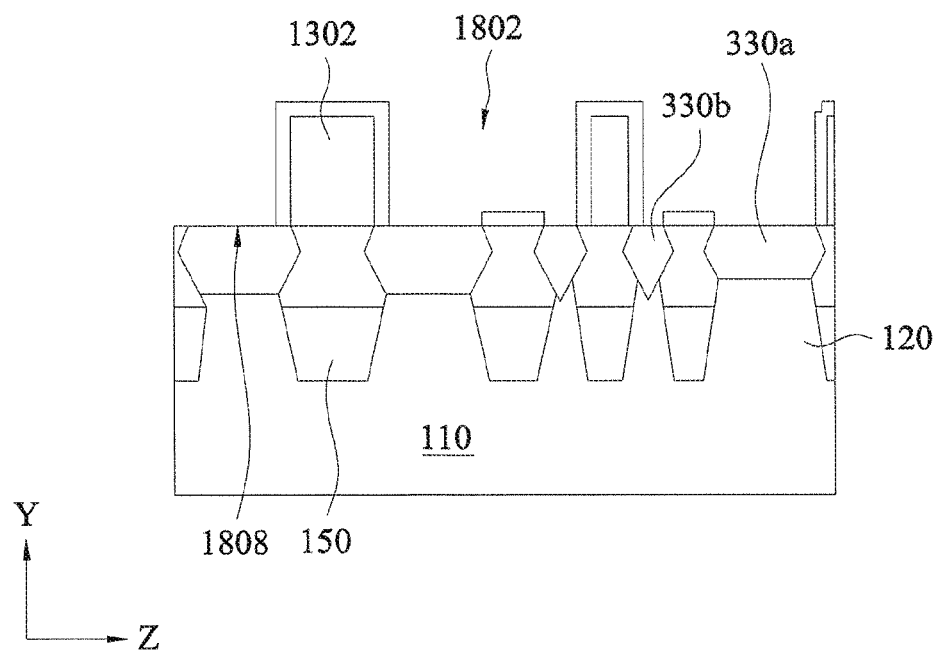
Figure 21C:
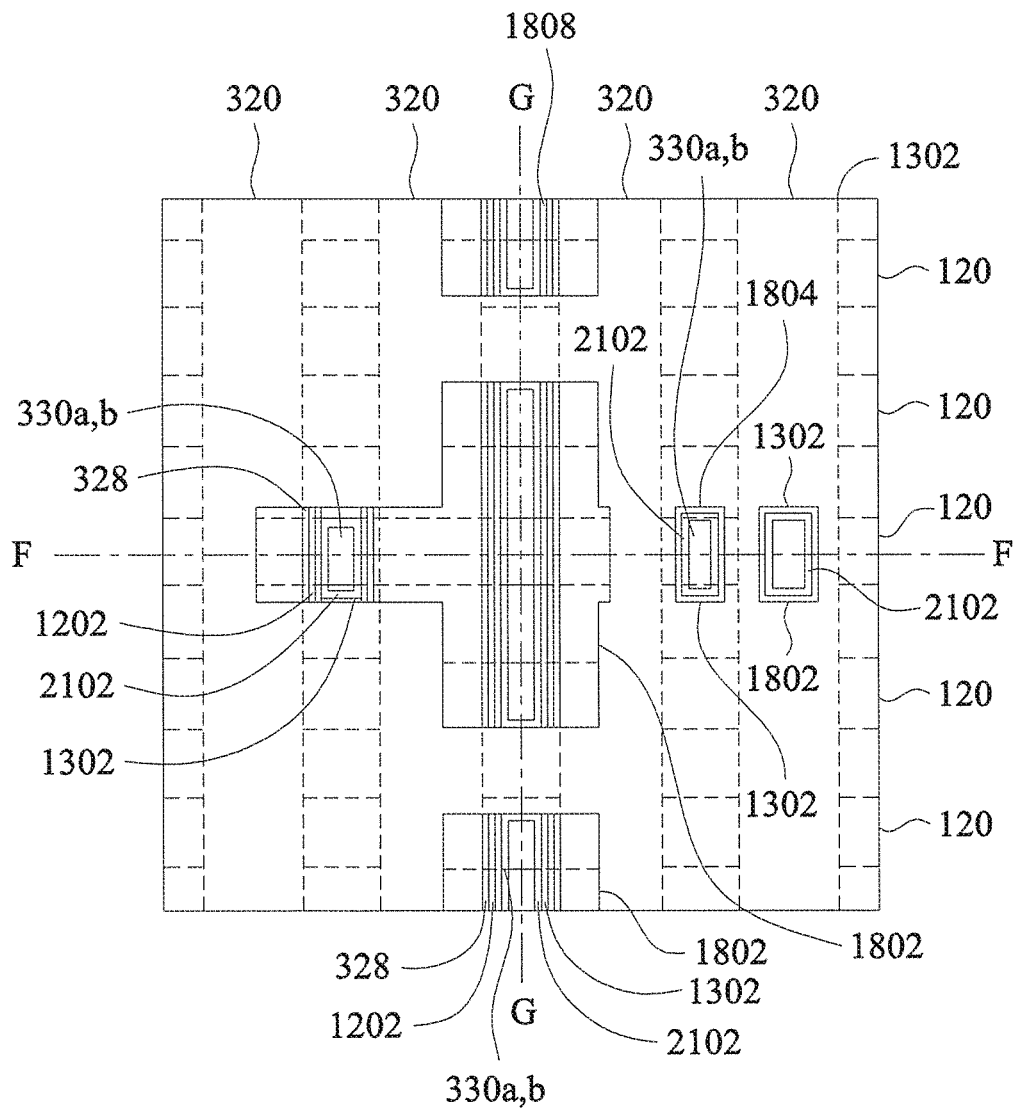

FIG. 21A is a cross-sectional view of the FinFET device 300 taken along line F-F of FIG. 21C and FIG. 21B is a cross-sectional view of the FinFET device 300 taken along line G-G of FIG. 21C, orthogonal to the cross-sectional view of FIG. 21A, at one stage of fabrication process according to an embodiment of the present disclosure. After CMP of the metal gate layer 1602, an operation of removing portions of the ILD layer 1302 is performed, thereby forming contact openings 1802. The portions of the ILD layer 1302 are removed using suitable etching operations. The ILD layer 1302 is etched by a dry etch operation in some embodiments, or by a wet etch operation in other embodiments.

Similarly to FIG. 18C, FIG. 21C, is a plan view showing exemplary openings 1802, 1804, 1808 in the ILD layer 1302. Dashed lines illustrate the outlines of the gate stacks 320 and fins 120 where covered by only one overlying layer (either ILD layer 1302 or gate stack 320). The outlines of the fins 120 are not shown where they are covered by two overlying layers (both ILD layer 1302 and gate stack 320). The sidewall spacers 328 and CESL 1202 are only shown in the openings 1802, 1804, 1808.

In contrast to FIGS. 18A and 18B, a spacer material layer 2102 is disposed uniformly on the remaining ILD layer 1302 and gate stacks 320 within the contact openings 1802. In certain embodiments, the spacer material layer 2102 is a carbon-based layer.

The carbon-based layer 2102 may be formed by exposing the plurality of gate structures to a gas mixture of hydrogen, ammonia, acetylene, and helium. A pressure of the gas mixture exposed to the gate structures ranges from about 0.1 to about 100 Torr in some embodiments, and from about 1 to about 10 Torr in other embodiments. In certain embodiments, the hydrogen and the acetylene are supplied to the gate structures at a flow rate of about 30 to about 3000 sccm, the ammonia is supplied to the gate structures at a flow rate of about 75 to about 7500, and the helium is supplied to the gate structures at a flow rate of about 150 to 15,000 sccm. In certain embodiments, the carbon-based layer 2102 is formed at a temperature of about 200° C. to about 600° C. In certain embodiments, the carbon-based layer 2102 is formed to a thickness of about 10 nm to about 50 nm.

The carbon-based layer 2102 is formed on underlying oxide and nitride layers. In embodiments of the present disclosure, the gas mixture selectively reacts with the oxide and nitride layers, thereby forming a carbon-based layer 2102 on the side walls of the contacts, but no carbon-based layer 2102 is formed on the source/drains 330a, 330b.

Figure 22A:
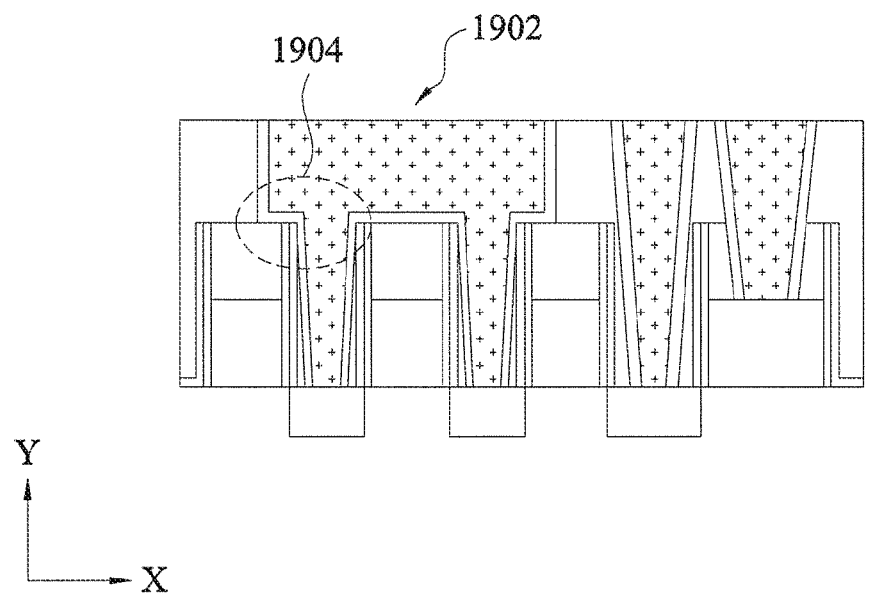
Figure 22B:
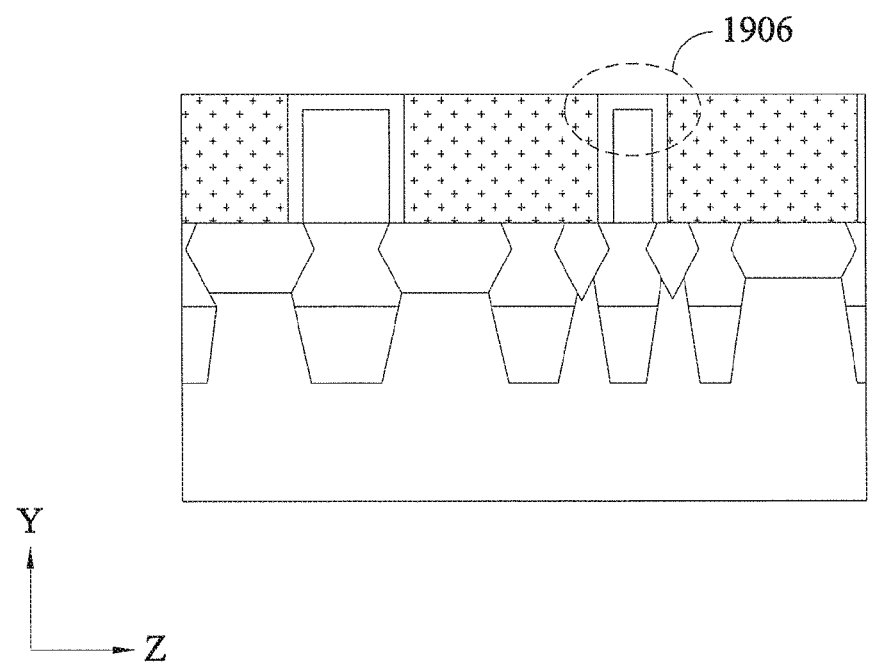

FIG. 22A is a cross-sectional view of the FinFET device 300 and FIG. 22B is a cross-sectional view of the FinFET device 300, orthogonal to the cross-sectional view of FIG. 22A, at one stage of a fabrication process according to an embodiment of the present disclosure. A pre-clean operation is performed in FIGS. 22A and 22B in a manner similar to that described in FIGS. 19A and 19B, except the pre-clean material 1902 is formed over the spacer material layer 2102. As shown in FIGS. 22A and 22B, the spacer material layer 2102 protects the sidewall spacers 328, the CESL 1202, and ILD layer 1302 from being damaged by the pre-clean material 1902. The spacer material layer 2102 prevents portions of the metal gate 1602 from being exposed (for example, see region 1904) and prevents lateral loss of the ILD layer 1302.

The pre-clean material 1902 is subsequently removed, such as by a suitable etchant that is selective to the pre-clean material 1902. Suitable etchants include an acidic etchant, such as one or more of nitric acid, hydrofluoric acid, sulfuric acid, phosphoric acid, and hydrochloric acid.

Subsequent to removal of the pre-clean material, the spacer material layer 2102 is removed by a suitable operation. For example, when the spacer material layer 2102 is a carbon-based layer, the layer is removed by an oxygen plasma in certain embodiments.

Figure 23A:
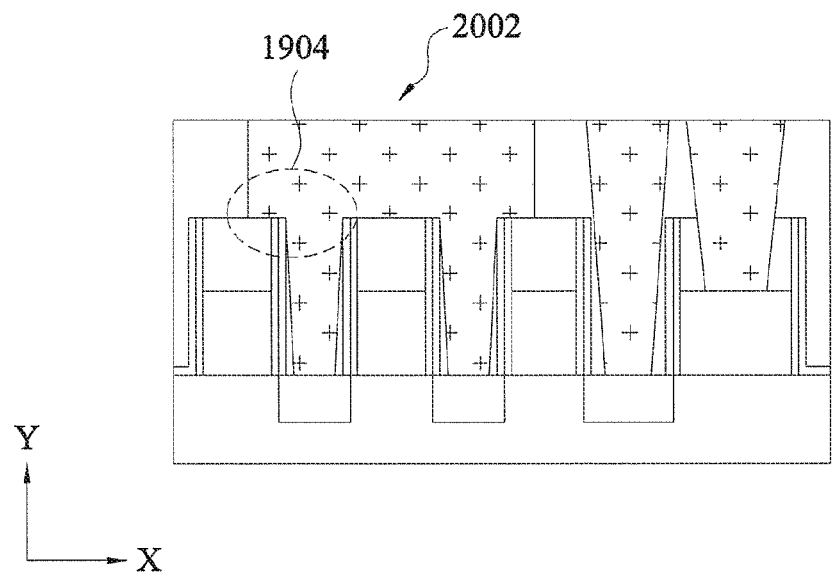
Figure 23B:
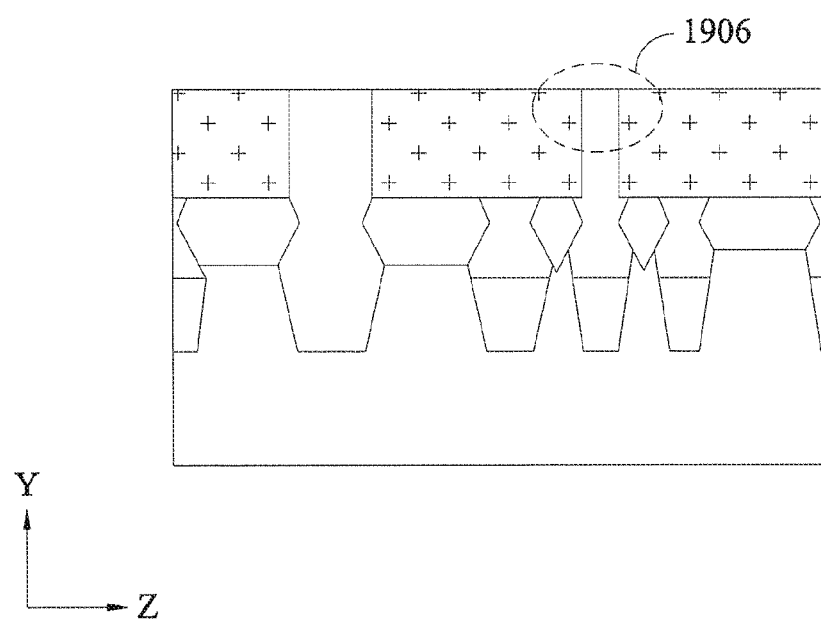

FIG. 23A is a cross-sectional view of the FinFET device 200 and FIG. 23B is a cross-sectional view of the FinFET device 200, orthogonal to the cross-sectional view of FIG. 23A, at one stage of a fabrication process according to an embodiment of the present disclosure. After removal of the pre-clean material 1902 and the spacer material layer 2102, an operation of depositing an interconnect layer 2002 may be performed. In some aspects, the interconnect layer 2002 serves as a contact plug to interconnect the FinFET device 300 to upper wiring layers (not shown). A suitable conductive material, such as copper, tungsten, nickel, titanium, or the like, is deposited within the contact openings 1802. For example, tungsten may be used to form tungsten plugs in the contact openings 1802. The interconnect layer 2002 may be formed by CVD, PVD, or plating.

In contrast to FIGS. 20A and 20B, where the spacer material layer was not formed prior to the pre-clean operation, an electrical short is not formed between the interconnect 2002 formed within the contact opening 1802 and the metal gate layer 1602 (see FIG. 23A, region 1904). In addition, as shown in FIG. 23B, an electrical short is not formed from a first contact layer region through the thin column of the ILD layer 1302 to a second contact layer region.

The FinFET device 300 serves only as one example. The FinFET device 300 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment of the present disclosure, a method of fabricating a FinFET device is provided. The method includes forming a carbon-based layer on a plurality of gate structures formed on a semiconductor substrate. Each gate structure overlies at least one fin formed on the semiconductor substrate, and the carbon-based layer covering sidewalls of the gate structures. A metal silicide layer is formed overlying the carbon-based layer. The metal silicide layer and carbon-based layer are removed, and a conductive material is deposited between adjacent gate structures.

In another embodiment of the disclosure, a method of fabricating a FinFET device is provided. The method includes forming a plurality of fins on a semiconductor substrate and forming a plurality of gate structures, wherein each gate structure overlies at least one fin. Source and drain regions are formed on the fins adjacent the gate structures. An interlayer dielectric is formed on the plurality of fins and gate structures, and openings are formed in the interlayer dielectric exposing the source and drain regions. A carbon-based layer is formed on sidewalls of the openings, and a metal silicide layer is formed overlying the carbon-based layer. The metal silicide layer and carbon-based layer are removed, and a conductive material is deposited in the openings.

In another embodiment of the disclosure, a method of fabricating a FinFET device is provided. The method includes forming a plurality of gate structures on a semiconductor substrate, wherein each gate structure overlies at least one fin. Source and drain regions are formed on the at least one fin adjacent the gate structures. An interlayer dielectric is formed on the plurality of fins and gate structures, and openings are formed in the interlayer dielectric exposing the source and drain regions. A carbon-based layer is formed on sidewalls of the openings by supplying a gas mixture of hydrogen, ammonia, acetylene, and helium to the openings. The carbon-based layer is removed, a conductive material is deposited in the openings.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field-effect transistor (FinFET) device, the method comprising:
    forming a carbon-based layer on a plurality of gate structures formed on a semiconductor substrate, each gate structure overlying at least one fin formed on the semiconductor substrate, and the carbon-based layer covering sidewalls of the gate structures;
    forming a metal silicide layer overlying the carbon-based layer;
    removing the metal silicide layer and carbon-based layer; and
    depositing a conductive material between adjacent gate structures.

2. The method of claim 1, wherein the carbon-based layer is formed on underlying oxide and nitride layers.

3. The method of claim 1, wherein the forming a carbon-based layer comprises exposing the plurality of gate structures to a gas mixture of hydrogen, ammonia, acetylene, and helium.

4. The method of claim 3, wherein a pressure of the gas mixture exposed to the gate structures ranges from about 0.1 to about 100 Torr.

5. The method of claim 4, wherein the pressure of the gas mixture ranges from about 1 to about 10 Torr.

6. The method of claim 3, wherein the hydrogen and the acetylene are supplied to the gate structures at a flow rate of about 30 to about 3000 sccm, the ammonia is supplied to the gate structures at a flow rate of about 75 to about 7500, and the helium is supplied to the gate structures at a flow rate of about 150 to 15,000 sccm.

7. The method of claim 1, wherein the carbon-based layer is formed at a temperature of about 200° C. to about 600° C.

8. The method of claim 1, wherein the carbon-based layer is formed to a thickness of about 10 nm to about 50 nm.

9. The method of claim 1, wherein the gas mixture selectively reacts with oxide and nitride layers.

10. The method of claim 1, wherein the carbon-based layer is removed using an oxygen plasma.

11. A method of fabricating a fin field-effect transistor (FinFET) device, the method comprising:
    forming a plurality of fins on a semiconductor substrate;
    forming a plurality of gate structures, each gate structure overlying at least one fin;
    forming source and drain regions on the fins adjacent the gate structures;
    forming an interlayer dielectric on the plurality of fins and gate structures;
    forming openings in the interlayer dielectric exposing the source and drain regions;
    forming a carbon-based layer on sidewalls of the openings;
    forming a metal silicide layer overlying the carbon-based layer;
    removing the metal silicide layer and carbon-based layer; and
    depositing a conductive material in the openings.

12. The method of claim 11, wherein the forming openings in the interlayer dielectric exposes one or more gate structures.

13. The method of claim 11, wherein the forming a metal silicide layer comprises depositing a silicide at a temperature of about 50° C. to about 150° C.

14. The method of claim 11, wherein the metal silicide layer is removed using an acidic etchant and the carbon-based layer is removed using an oxygen plasma.

15. The method of claim 11, wherein the forming a carbon-based layer comprises supplying a gas mixture of hydrogen, ammonia, acetylene, and helium to the openings.

16. The method of claim 15, wherein the gas mixture is supplied at a pressure in a range of from about 0.1 to about 100 Torr, and at a temperature of about 200° C. to about 600° C.

17. The method of claim 15, wherein the hydrogen and the acetylene are supplied to the openings at a flow rate of about 30 to about 3000 sccm, the ammonia is supplied to the gate structures at a flow rate of about 75 to about 7500, and the helium is supplied to the gate structures at a flow rate of about 150 to 15,000 sccm.

18. A method of fabricating a fin field-effect transistor (FinFET) device, the method comprising:
    forming a plurality of gate structures on a semiconductor substrate, each gate structure overlying at least one fin;
    forming source and drain regions on the at least one fin adjacent the gate structures;
    forming an interlayer dielectric on the plurality of fins and gate structures;
    forming openings in the interlayer dielectric exposing the source and drain regions;
    forming a carbon-based layer on sidewalls of the openings by supplying a gas mixture of hydrogen, ammonia, acetylene, and helium to the openings;
    removing the carbon-based layer; and
    depositing a conductive material in the openings.

19. The method of claim 18, wherein the hydrogen and the acetylene are supplied to the openings at a flow rate of about 30 to about 3000 sccm, the ammonia is supplied to the gate structures at a flow rate of about 75 to about 7500, and the helium is supplied to the gate structures at a flow rate of about 150 to 15,000 sccm.

20. The method of claim 18, further comprising forming a metal silicide layer in the openings after forming the carbon based layer, and removing the metal silicide layer before removing the carbon-based layer.

* * * * *